(12) United States Patent
Kameda et al.

(10) Patent No.: US 9,587,308 B2
(45) Date of Patent: Mar. 7, 2017

(54) CLEANING METHOD, METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Kenji Kameda, Toyama (JP); Ryuji Yamamoto, Kodaira (JP); Yuji Urano, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/622,115

(22) Filed: Feb. 13, 2015

(65) Prior Publication Data

US 2015/0232986 A1  Aug. 20, 2015

(30) Foreign Application Priority Data

Feb. 17, 2014  (JP) .................................. 2014-027905

(51) Int. Cl.
| | |
|---|---|
| H01L 21/02 | (2006.01) |
| C23C 16/44 | (2006.01) |
| C23C 16/34 | (2006.01) |
| C23C 16/36 | (2006.01) |
| C23C 16/455 | (2006.01) |

(52) U.S. Cl.
CPC ........ C23C 16/4405 (2013.01); C23C 16/345 (2013.01); C23C 16/36 (2013.01); C23C 16/45546 (2013.01); H01L 21/0228 (2013.01); H01L 21/02167 (2013.01); H01L 21/02211 (2013.01)

(58) Field of Classification Search
CPC ....................................................... H01L 21/02
USPC ......................... 438/758, 643, 763, 790, 788
See application file for complete search history.

(56) References Cited

U.S. PATENT DOCUMENTS

| | | | |
|---|---|---|---|
| 8,741,783 B2 | 6/2014 | Kameda et al. | |
| 2009/0149032 A1* | 6/2009 | Kameda ............... | C23C 16/4405 438/778 |
| 2011/0318937 A1 | 12/2011 | Akae et al. | |

FOREIGN PATENT DOCUMENTS

| | | |
|---|---|---|
| JP | 2013-077803 A | 4/2013 |
| KR | 10-2011-0134323 | 12/2011 |
| KR | 10-2013-0029360 A | 3/2013 |

\* cited by examiner

*Primary Examiner* — Chuong A Luu
*Assistant Examiner* — Rodolfo D Fortich
(74) *Attorney, Agent, or Firm* — Volpe and Koenig, P.C.

(57) ABSTRACT

A cleaning method includes performing a first cleaning process of supplying a fluorine-based gas from a first nozzle heated to a first temperature and a nitrogen oxide-based gas from a second nozzle heated to a first temperature into a process chamber heated to the first temperature in order to remove on surfaces of members in the process chamber by a thermochemical reaction, changing in internal temperature of the process chamber to a second temperature higher than the first temperature, and performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.

16 Claims, 8 Drawing Sheets

FIG. 5C

| Boat loading Pressure adjustment Temperature adjustment | Tube : $F_2$ + NO Etching | Temperature rising | Tube : $F_2$ + NO Treatment | Nozzle : $F_2$ Etching | Purge Return to atmospheric pressure Boat unloading |

Cleaning time

CLEANING METHOD, METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japan Patent Applications No. 2014-027905, filed on Feb. 17, 2014, the entire contents of which are incorporated herein by reference.

TECHNICAL FIELD

The present disclosure relates to a cleaning method, a method of manufacturing a semiconductor device, a substrate processing apparatus and a recording medium.

BACKGROUND

As one of the processes for manufacturing a semiconductor device, there may be a process of forming a thin film on a substrate in a process chamber, which is heated to a film forming temperature, by supplying a precursor gas or a reaction gas from a nozzle, which is heated to the film forming temperature, to the substrate. During this film forming process, deposits such as a thin film are adhered to the interior of the process chamber. Therefore, a cleaning process of removing the deposits adhered to the interior of the process chamber may be performed by supplying a cleaning gas into the process chamber after the film forming process.

During the above-mentioned film forming process, the deposits are adhered to the interior of the nozzle heated to the film forming temperature as well as the interior of the process chamber. However, in some cases, even the above-mentioned cleaning process may not remove the deposits from the interior of the nozzle.

SUMMARY

The present disclosure provides some embodiments of a technique capable of removing deposits from the interiors of a process chamber and a nozzle.

According to an aspect of the present disclosure, there is provided a technique including: performing a process of forming a film on a substrate in a process chamber heated to a film forming temperature by performing a cycle a predetermined number of times, the cycle including supplying a precursor gas from a first nozzle heated to the film forming temperature to the substrate, and supplying a reaction gas, which is different in chemical structure from the precursor gas, from a second nozzle heated to the film forming temperature to the substrate; performing a first cleaning process of supplying a fluorine-based gas from the first nozzle heated to a first temperature and a nitrogen oxide-based gas from the second nozzle heated to the first temperature into the process chamber heated to the first temperature in order to remove deposits including the film deposited on surfaces of members in the process chamber by a thermochemical reaction; changing an internal temperature of the process chamber to a second temperature higher than the first temperature; and performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.

BRIEF DESCRIPTION OF THE DRAWINGS

FIG. 5C is a flow diagram of a cleaning sequence according to a reference example.

DETAILED DESCRIPTION

One Embodiment

One embodiment of the present disclosure will now be described in detail with reference to FIGS. 1 to 3.

(1) Configuration of Substrate Processing Apparatus

Figure 1:
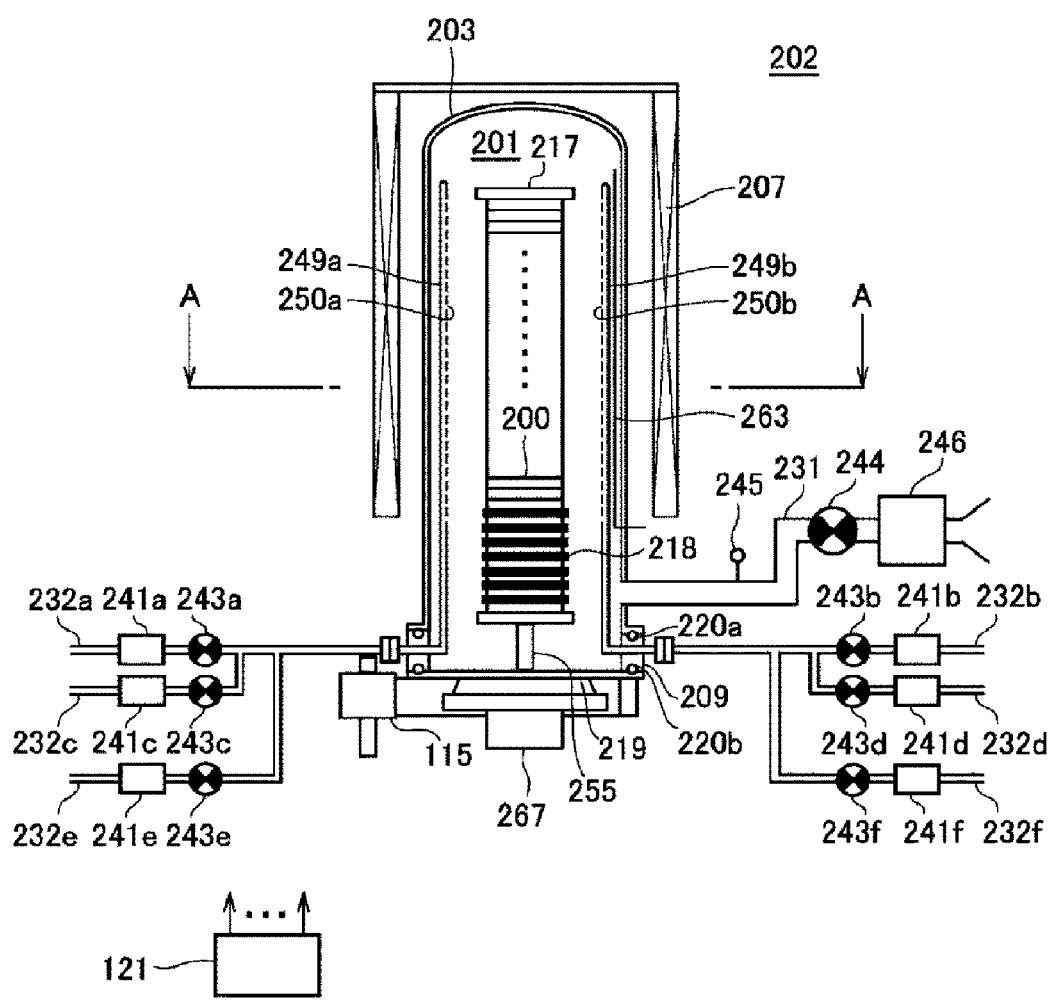
FIG. 1 is a schematic view illustrating a configuration of a vertical processing furnace of a substrate processing apparatus suitably used in one embodiment of the present disclosure, the processing furnace being shown in a longitudinal sectional view.
Figure 2:
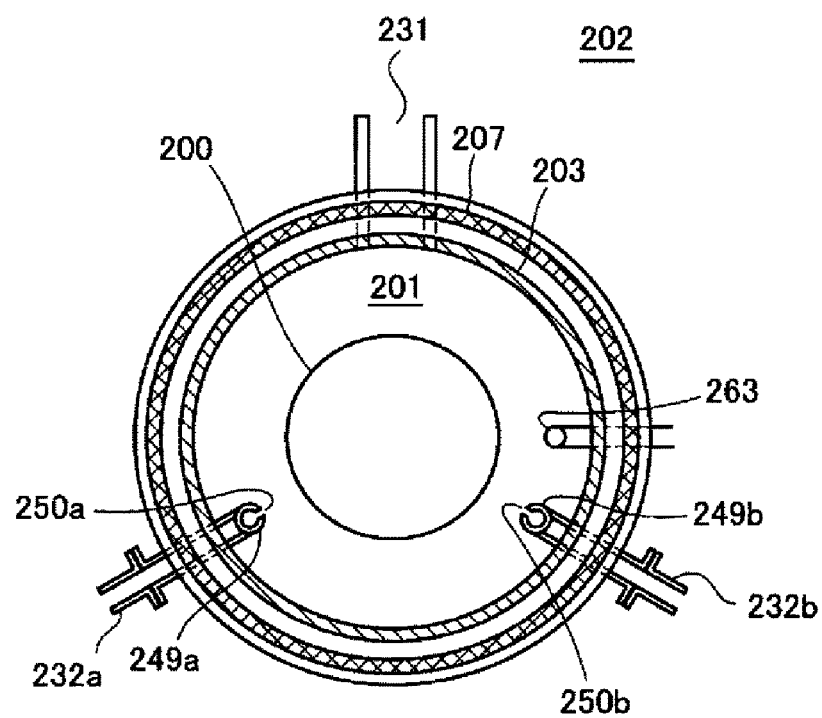
FIG. 2 is a schematic view illustrating a configuration of the vertical processing furnace of the substrate processing apparatus suitably used in the embodiment of the present disclosure, the processing furnace being shown in a sectional view taken along a line A-A in FIG. 1.

As shown in FIG. 1, a processing furnace 202 includes a heater 207 as a heating unit (heating mechanism). The heater 207 has a cylindrical shape and is vertically installed by being supported by a heater base (not shown) as a support plate. The heater 207 also serves as an activating mechanism (exciting unit) to activate (excite) a gas with heat, which will be described later.

A reaction tube 203 is disposed inside the heater 207 in a concentric form with the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is disposed below the reaction tube 203 in a concentric form with the reaction tube 203. The manifold 209 is made of, for example, metal such as stainless steel (SUS), and is formed in a cylindrical shape with its upper and lower ends opened. The upper end of the manifold 209 engages with the lower end of the reaction tube 203 and is configured to support the reaction tube 203. An O-ring 220a as a seal member is installed between the manifold 209 and the reaction tube 203. As the manifold 209 is supported by the heater base, the reaction tube 203 is in a vertically installed state. A process vessel (reaction vessel) is mainly constituted by the reaction tube 203 and the manifold 209. A process chamber 201 is defined in a hollow cylindrical portion of the process vessel. The process chamber 201 is configured to accommodate a plurality of wafers 200 as substrates in a state where horizontally-positioned wafers 200 are vertically stacked in multiple stages in a boat 217 described later.

Nozzles 249a and 249b are installed in the process chamber 201 to extending through the manifold 209. The nozzles 249a and 249b are made of, for example, heat resistant material such as quartz or SiC. The nozzles 249a and 249b are connected with gas supply pipes 232a and 232b, respectively. The gas supply pipe 232a is connected with a gas supply pipe 232c and the gas supply pipe 232b is connected with a gas supply pipe 232d. In this way, the two nozzles 249a and 249b and the four gas supply pipes 232a to 232d are installed at the reaction tube 203, and thus, a plurality kinds of gases can be supplied into the process chamber 201.

MFCs (Mass flow controllers) 241a to 241d, which are flow rate controllers (flow rate control parts), and valves 243a to 243d, which are opening/closing valves, are respectively installed in the gas supply pipes 232a to 232d in this order from an upstream side. Gas supply pipes 232e and 232f for supplying an inert gas are respectively connected to the gas supply pipes 232a and 232b at a downstream side of the valves 243a and 243b. MFCs 241e and 241f, which are flow rate controllers (flow rate control parts), and valves 243e and 243f, which are opening/closing valves, are respectively installed in the gas supply pipes 232e and 232f in this order from an upstream side.

The nozzles 249a and 249b are connected to leading end portions of the gas supply pipes 232a and 232b, respectively. As shown in FIG. 2, the nozzles 249a and 249b are respectively installed in an annular space between the inner wall of the reaction tube 203 and the wafers 200. The nozzles 249a and 249b are vertically disposed along the inner wall of the reaction tube 203 to extend upward in the stacking direction of the wafers 200. That is, the nozzles 249a and 249b are respectively installed in a region horizontally surrounding a wafer arrangement region in which the wafers 200 are arranged, while being arranged along the wafer arrangement region. The nozzles 249a and 249b are respectively formed of L-shaped long nozzles. Respective horizontal portions of the nozzles 249a and 249b are installed to extending through a lower sidewall of the reaction tube 203, while respective vertical portions the nozzles 249a and 249b being installed to extend upward from at least one end portion of the wafer arrangement region toward the other end portion thereof. A plurality of gas supply holes 250a and 250b through which gas is supplied is formed in side surfaces of the nozzles 249a and 249b, respectively. The gas supply holes 250a and 250b are opened toward the center of the reaction tube 203 so that a gas can be supplied toward the wafers 200. The plurality of gas supply holes 250a and 250b having the same opening area are disposed over a space from a lower portion to an upper portion of the reaction tube 203 with the same opening pitch therebetween.

As described above, the gas is transferred via the nozzles 249a and 249b in this embodiment, where the nozzles 249a and 249b are disposed inside an annular vertically extending space, i.e., a cylindrical space defined by the inner wall of the reaction tube 203 and the end portions of the stacked wafers 200. The gas is first ejected into the reaction tube 203 near the wafers 200 through the opened gas supply holes 250a and 250b of the nozzles 249a and 249b, respectively. Thus, a main flow of the gas in the reaction tube 203 follows a direction parallel to surfaces of the wafers 200, i.e., the horizontal direction. With this configuration, the gas can be uniformly supplied to the respective wafers 200 and this makes it possible to improve the uniformity of the thickness of a film formed on the surface of each of the wafers 200. A gas flowing over the surfaces of the wafers 200, i.e., a residual gas after the reaction, flows toward an exhaust port, i.e., the exhaust pipe 231 described later. However, a flow direction of the residual gas is not limited to the vertical direction but may be suitably adjusted depending on a position of the exhaust port.

A precursor gas containing certain elements, for example, a halosilane precursor gas containing Si and a halogen element, is supplied from the gas supply pipe 232a into the process chamber 201 through the MFC 241a, the valve 243a and the nozzle 249a.

The halosilane precursor gas may include to a halosilane precursor in a gaseous state, for example, a gas obtained by vaporizing a halosilane precursor that is in a liquid state under normal temperature and pressure, a halosilane precursor that is in a gaseous state under normal temperature and pressure, or the like. The halosilane precursor may include to a silane precursor having a halogen group. Examples of the halogen group include a chloro group, a fluoro group, a bromo group, an iodine group or the like. That is, the halogen group contains a halogen element such as chlorine (Cl), fluorine (F), bromine (Br), iodine (I) or the like. The halosilane precursor may refer to a kind of halide. When the term "precursor" is used herein, it may refer to "a liquid precursor in a liquid state," "a precursor gas in a gaseous state," or both of them.

As the halosilane precursor gas, for example, a precursor gas containing Si and Cl, i.e., a chlorosilane precursor gas may be used. As the chlorosilane precursor gas, a dichlorosilane ($SiH_2Cl_2$, abbreviation: DCS) gas or a hexachlorodisilane ($Si_2Cl_6$, abbreviation: HCDS) gas may be used. When a liquid precursor in a liquid state under normal temperature and pressure such as HCDS is used, the liquid precursor is vaporized by a vaporization system such as a vaporizer or a bubbler, and then supplied as a precursor gas (HCDS gas).

A reaction gas different in chemical structure (molecular structure) from the precursor gas, for example, a nitrogen (N)-containing gas, is supplied from the gas supply pipe 232b into the process chamber 201 via the MFC 241b, the valve 243b and the nozzle 249b. An example of the nitrogen-containing gas may include a hydrogen nitride-based gas. The hydrogen nitride-based gas may also refer to a material consisting of only two elements of N and H and acts as a nitriding gas, i.e., an N source, in a substrate processing process, which will be described later. As an example of the hydrogen nitride-based gas, an ammonia ($NH_3$) gas may be used.

A reaction gas different in chemical structure (molecular structure) from the precursor gas, for example, a carbon (C)-containing gas, is supplied from the gas supply pipe 232b into the process chamber 201 via the MFC 241b, the valve 243b and the nozzle 249b. As the carbon-containing gas, a hydrogen carbide-based gas may be used. The hydrogen carbide-based gas may also refer to a material consisting of only two elements of C and H and acts as a C source in a substrate processing process, which will be described later. As the hydrogen carbide-based gas, a propylene ($C_3H_6$) gas may be used.

A fluorine-based gas as a cleaning gas is supplied from the gas supply pipes 232c and 232d into the process chamber 201 via the MFCs 241c and 241d, the valves 243c and 243d, the gas supply pipes 232a and 232b and the nozzle 249a and 249b, respectively. As the fluorine-based gas, a fluorine ($F_2$) gas may be used.

A nitrogen oxide-based gas as a cleaning gas is supplied from the gas supply pipes 232c and 232d into the process chamber 201 via the MFCs 241c and 241d, the valves 243c and 243d, the gas supply pipes 232a and 232b and the nozzle 249a and 249b, respectively. The nitrogen oxide-based gas cannot perform a cleaning action by itself. However, when the nitrogen oxide-based gas reacts with the fluorine-based gas, it generates active species such as a halogenated nitrosyl compound to act to enhance a cleaning action of the fluorine-based gas. As the nitrogen oxide-based gas, a nitric oxide (NO) gas may be used.

An inert gas such as a nitrogen ($N_2$) gas is supplied from the gas supply pipes 232e and 232f into the process chamber 201 via the MFCs 241e and 241f, the valves 243e and 243f, the gas supply pipes 232a and 232b and the nozzle 249a and 249b, respectively.

When flowing the above-mentioned precursor gas from the gas supply pipe 232a, the gas supply pipe 232a, the MFC 241a and the valve 243a mainly constitute a precursor gas supply system. The nozzle 249a may be included in the precursor gas supply system. The precursor gas supply system may be also called a precursor supply system. When the halosilane precursor gas is flown from the gas supply pipe 232a, the precursor gas supply system may be also called a halosilane precursor gas supply system or a halosilane precursor supply system.

When supplying the nitrogen-containing gas from the gas supply pipe 232b, the gas supply pipe 232b, the MFC 241b and the valve 243b mainly constitute a nitrogen-containing gas supply system. The nozzle 249b may be included in the nitrogen-containing gas supply system. The nitrogen-containing gas supply system may be also called a nitriding gas supply system or a nitriding agent supply system. When flowing the hydrogen nitride-based gas from the gas supply pipe 232b, the nitrogen-containing gas supply system may be also called a hydrogen nitride-based gas supply system or a hydrogen nitride supply system.

When supplying the carbon-containing gas from the gas supply pipe 232b, the gas supply pipe 232b, the MFC 241b and the valve 243b mainly constitute a carbon-containing gas supply system. The nozzle 249b may be included in the carbon-containing gas supply system. When flowing the hydrogen carbide-based gas from the gas supply pipe 232b, the carbon-containing gas supply system may be also called a hydrogen carbide-based gas supply system or a hydrogen carbide supply system.

One or both of the above-mentioned nitrogen-containing gas supply system and carbon-containing gas supply system may be also called a reaction gas supply system.

When supplying the fluorine-based gas from the gas supply pipe 232c, a fluorine-based gas supply system is mainly constituted by the gas supply pipe 232c, the MFC 241c and the valve 243c. The nozzle 249a at the downstream side of a connection of the gas supply pipe 232a with the gas supply pipe 232c may be included in the fluorine-based gas supply system. In supplying the fluorine-based gas from the gas supply pipe 232d, a fluorine-based gas supply system is mainly constituted by the gas supply pipe 232d, the MFC 241d and the valve 243d. The nozzle 249b at the downstream side of a connection of the gas supply pipe 232b with the gas supply pipe 232d may be included in the fluorine-based gas supply system.

When supplying the nitrogen oxide-based gas from the gas supply pipe 232c, a nitrogen oxide-based gas supply system is mainly constituted by the gas supply pipe 232c, the MFC 241c and the valve 243c. The nozzle 249a at the downstream side of a connection of the gas supply pipe 232a with the gas supply pipe 232c may be included in the nitrogen oxide-based gas supply system. When supplying the nitrogen oxide-based gas from the gas supply pipe 232d, a nitrogen oxide-based gas supply system is mainly constituted by the gas supply pipe 232d, the MFC 241d and the valve 243d. The nozzle 249b at the downstream side of a connection of the gas supply pipe 232b with the gas supply pipe 232d may be included in the nitrogen oxide-based gas supply system. The nitrogen oxide-based gas supply system may be also called a nitrogen oxide supply system.

One or both of the above-mentioned fluorine-based gas supply system and nitrogen oxide-based gas supply system may be also called a cleaning gas supply system.

An inert gas supply system is mainly constituted by the gas supply pipes 232e and 232f, the MFCs 241e and 241f and the valves 243e and 243f. The inert gas supply system may be also called a purge gas supply system or a carrier gas supply system.

The exhaust pipe 231 for exhausting an internal atmosphere of the process chamber 201 is installed at the reaction tube 203. A pressure sensor 245, which is a pressure detector (pressure detecting part) for detecting an internal pressure within the process chamber 201, an APC (Auto Pressure Controller) valve 244, which is an exhaust valve (pressure adjusting part), and a vacuum pump 246 as a vacuum exhaust device are connected to the exhaust pipe 231. The APC valve 244 is configured to start/stop vacuum exhaust in the process chamber 201 by opening/closing a valve in a state where the vacuum pump 246 is in operation, and further to adjust the internal pressure of the process chamber 201 by adjusting a degree of the valve opening based on pressure information detected by the pressure sensor 245 in a state where the vacuum pump 246 is in operation. An exhaust system is mainly constituted by the exhaust pipe 231, the APC valve 244 and the pressure sensor 245. The vacuum pump 246 may also be included in the exhaust system. The exhaust pipe 231 is not limited to being installed at the reaction tube 203 but may be installed at the manifold 209, like the nozzles 249a and 249b.

A seal cap 219 as a lid for a furnace opening configured to hermetically seal a lower end opening of the manifold 209 is installed under the manifold 209. The seal cap 219 is configured to contact the lower end of the manifold 209 from the lower side of the manifold 209 in the vertical direction. The seal cap 219 is made of, for example, metal such as stainless steel (SUS) and has a disc shape. An O-ring 220b, which is a seal member in contact with the lower end portion of the manifold 209, is installed at an upper surface of the seal cap 219. A rotary mechanism 267 configured to rotate the boat 217 described later is installed at a side of the seal cap 219 opposite to the process chamber 201. A rotary shaft 255 of the rotary mechanism 267 extends through the seal cap 219 and is connected to the boat 217. The rotary mechanism 267 is configured to rotate the wafers 200 by rotating the boat 217. The seal cap 219 is configured to be vertically moved by a boat elevator 115, which is an elevation mechanism vertically disposed at the outside of the reaction tube 203. The boat elevator 115 is configured to load and unload the boat 217 from the process chamber 201 by elevating or lowering the seal cap 219. That is, the boat elevator 115 is configured as a transfer device (transfer mechanism) that transfers the boat 217 and the wafers 200 supported by the boat 217 into and out of the process chamber 201.

The boat 217, which is used as a substrate support, is configured to support a plurality of wafers 200, e.g., 25 to 200 sheets, in a state where horizontally-positioned wafers 200 are vertically stacked in multiple stages, i.e., being separated from each other, with the centers of the wafers 200 aligned with each other. The boat 217 is made of, for example, heat resistant material such as quartz or silicon carbide (SiC). Heat insulating plates 218 including, for example, a heat resistant material such as quartz or silicon carbide (SiC) are stacked in multiple stages, being in a horizontal position, at a lower portion of the boat 217. With this configuration, heat from the heater 207 is difficult to be transferred to the seal cap 219. However, this embodiment is not limited thereto. Instead of installing the heat insulating plates 218 at the lower portion of the boat 217, a heat insulating tube formed of a tubular member including a heat resistant material such as quartz or SiC may be installed.

A temperature sensor 263, which is a temperature detector, is installed in the reaction tube 203. A condition of current applying to the heater 207 is adjusted based on temperature information detected by the temperature sensor 263, so that the interior of the process chamber 201 has a desired temperature distribution. The temperature sensor 263 has an L-shaped configuration, like the nozzles 249a and 249b, and is installed along the inner wall of the reaction tube 203.

Figure 3:
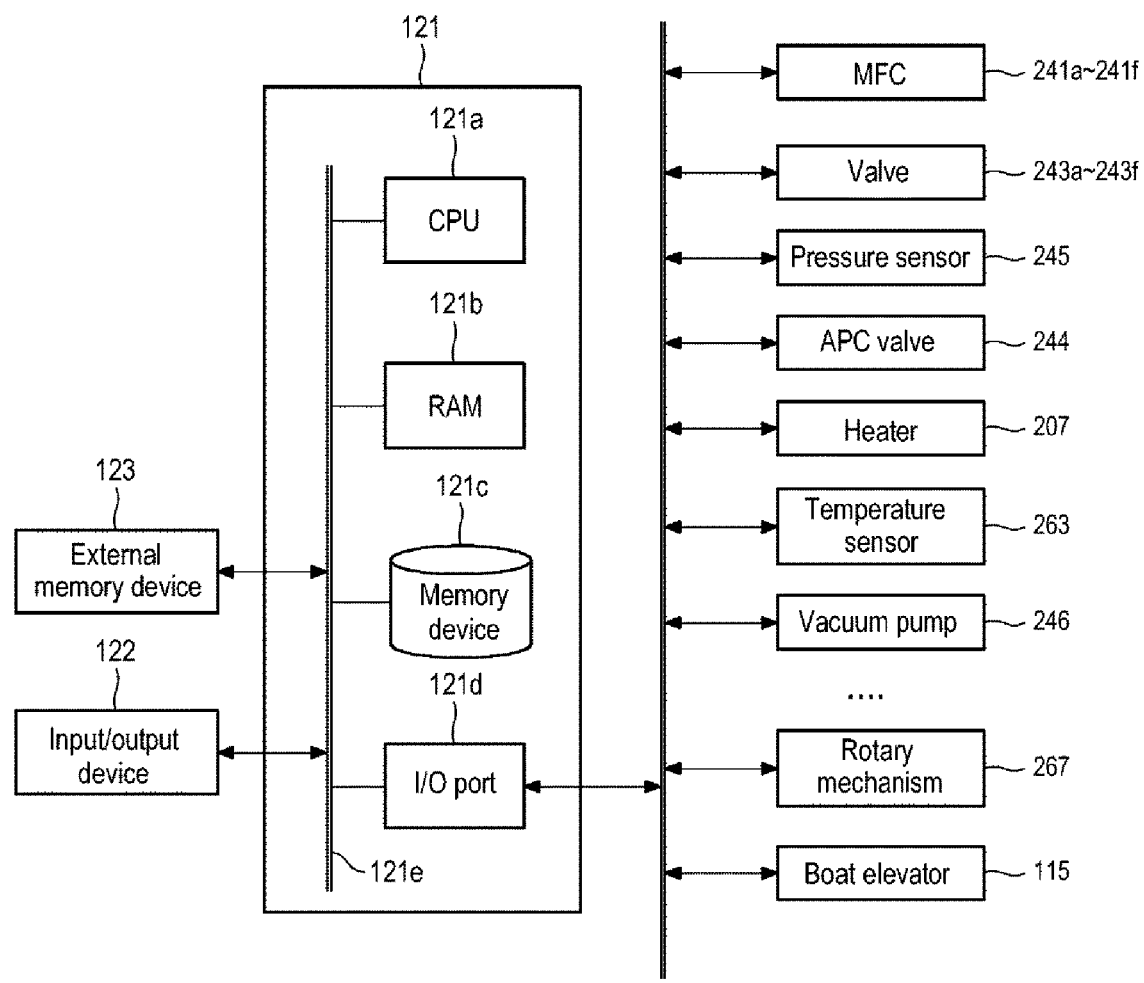
FIG. 3 is a schematic view illustrating a configuration of a controller of the substrate processing apparatus suitably used in the embodiment of the present disclosure, a control system of the controller being shown in a block diagram.

As illustrated in FIG. 3, a controller 121 serving as a control unit (control part) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like, is connected to the controller 121.

The memory device 121c is configured with, for example, a flash memory, an HDD (Hard Disc Drive), or the like. A control program for controlling operations of the substrate processing apparatus, a process recipe in which a sequence or condition for a substrate processing to be described later is written, and a cleaning recipe in which a sequence or condition for a cleaning process to be described later is written are readably stored in the memory device 121c. The process recipe, which is a combination of sequences, causes the controller 121 to execute each sequence in a substrate processing process to be described later in order to obtain a predetermined result, and functions as a program. The cleaning recipe, which is a combination of sequences, causes the controller 121 to execute each sequence in the cleaning process described later in order to obtain a predetermined result, and functions as a program. Hereinafter, the process recipe, the cleaning recipe or the control program may be generally referred to as a program. The When the term "program" is used herein, it may include the case in which only one of the process recipe, the cleaning recipe and the control program is included, or the case in which any combination of the process recipe, the cleaning recipe and the control program is included. The RAM 121b is configured as a memory area (work area) in which a program or data read by the CPU 121a is temporarily stored.

The I/O port 121d is connected to the above-described MFCs 241a to 241f, the valves 243a to 243f, the pressure sensor 245, the APC valve 244, the vacuum pump 246, the heater 207, the temperature sensor 263, the rotary mechanism 267, the boat elevator 115 and the like.

The CPU 121a is configured to read and execute the control program from the memory device 121c. According to an input of an operation command from the input/output device 122, the CPU 121a reads the process recipe from the memory device 121c. The CPU 121a is configured to control the flow rate controlling operation of various types of gases by the MFCs 241a to 241f, the opening/closing operation of the valves 243a to 243f, the opening/closing operation of the APC valve 244, the pressure adjusting operation by the APC valve 244 based on the pressure sensor 245, the operation of starting and stopping the vacuum pump 246, the temperature adjusting operation of the heater 207 based on the temperature sensor 263, the rotation and rotation speed adjusting operation of the boat 217 by the rotary mechanism 267, the elevation operation of the boat 217 by the boat elevator 115, and the like according to contents of the read process recipe.

The controller 121 is not limited to being configured as a dedicated computer but may be configured as a general-purpose computer. For example, the controller 121 of this embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. A means for supplying a program to a computer is not limited to the case in which the program is supplied through the external memory device 123. For example, the program may be supplied using a communication means such as Internet or a dedicated line, rather than through the external memory device 123. The memory device 121c or the external memory device 123 is configured as a non-transitory computer-readable recording medium. Hereinafter, these means for supplying the program will be simply referred to as "a recording medium." When the term "recording medium" is used herein, it may include a case in which only the memory device 121c is included, a case in which only the external memory device 123 is included, or a case in which both the memory device 121c and the external memory device 123 are included.

(2) Film Forming Process

Next, an example of a sequence of forming a film on a substrate, which is one of the processes for manufacturing a semiconductor device using the above-described substrate processing apparatus, will be described with reference to FIG. 4A. In the following description, operations of various parts constituting the substrate processing apparatus are controlled by the controller 121.

Figure 4A:
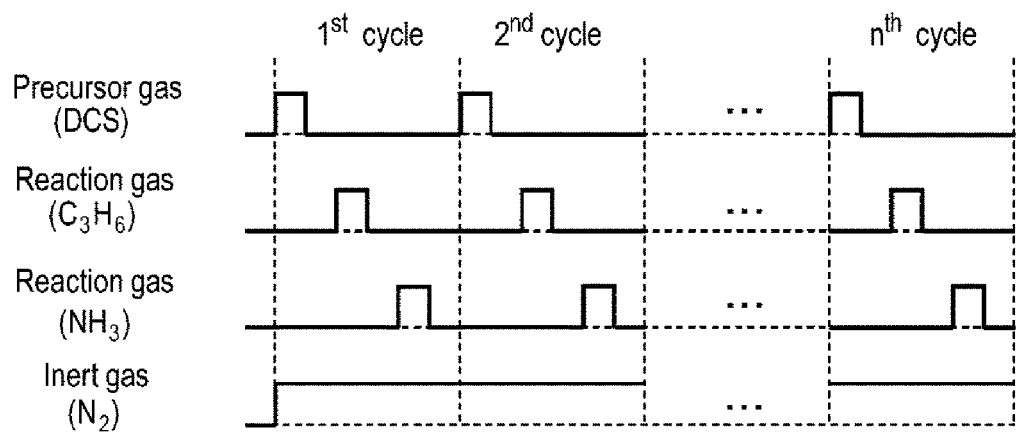
FIG. 4A is a view illustrating gas supply timings in a film forming sequence according to one embodiment of the present disclosure and FIG. 4B is a view illustrating gas supply timings in a film forming sequence according to another embodiment of the present disclosure.

In the film forming sequence shown in FIG. 4A, a silicon carbonitride film (SiCN film) is formed on a wafer 200 as a substrate in the process chamber 201 heated to a film forming temperature by performing a cycle by a predetermined number of times, the cycle including: supplying a DCS gas containing silicon as a precursor gas from the nozzle 249a as a first nozzle heated to the film forming temperature to the wafer 200 (Step 1); supplying a $C_3H_6$ gas containing carbon as a reaction gas from the nozzle 249b as a second nozzle heated to the film forming temperature (Step 2); and supplying a $NH_3$ gas containing nitrogen as a reaction gas from the nozzle 249b as the second nozzle heated to the film forming temperature (Step 3).

Here, a case where a cycle in which Step 1 to Step 3 are not performed simultaneously, i.e., Step 1 to Step 3 are performed sequentially and not synchronized, is performed a predetermined number of times (n times) will be described as one example. In this embodiment, "performing a cycle a predetermined number of times" refers to performing a cycle once or plural times. That is, it means performing the cycle once or more than once. FIG. 4A illustrates an example of repeating a cycle n times.

In the present disclosure, the term "wafer" may be used for referring to not only a wafer per se but also a laminated body (aggregate) of a wafer and certain layers or films formed on a surface of the wafer (that is, a wafer including certain layers or films formed on a surface of the wafer is sometimes referred to as a "wafer"). In the present disclosure, the term "surface of a wafer" may mean a surface (exposed surface) of a wafer per se, or a surface of a specified layer or film formed on the wafer, namely an outermost surface of the wafer as a laminated body.

In the present disclosure, the expression "supplying a specified gas to a wafer" may mean that the specified gas is directly supplied to a surface (exposed surface) of a wafer per se, or that the specified gas is supplied to a surface of a certain layer or film formed on the wafer, namely to an outermost surface of the wafer as a laminated body. In the present disclosure, the expression "forming a certain layer (or film) on a wafer" may mean that the certain layer (or film) is directly formed on the surface (exposed surface) of the wafer per se, or that the certain layer (or film) is formed on the surface of a certain layer or film formed on the wafer, namely on an outermost surface of the wafer as a laminated body.

In the present disclosure, the term "substrate" is interchangeably used with the term "wafer." Thus, with regard to the aforementioned description, the term "wafer" may be replaced with the term "substrate."

(Wafer Charging and Boat Loading)

When a plurality of wafers 200 are charged on the boat 217 (wafer charging), as illustrated in FIG. 1, the boat 217 holding the plurality of wafers 200 is lifted up by the boat elevator 115 to be loaded into the process chamber 201 (boat loading). In this state, the seal cap 219 seals the lower end portion of the manifold 209 via the O-ring 220b.

(Pressure Adjustment and Temperature Adjustment)

The interior of the process chamber 201 (i.e., the space in which the wafers 200 exist) is evacuated (or depressurized) by the vacuum pump 246 to reach a desired pressure (vacuum level). Here, the internal pressure of the process chamber 201 is measured by the pressure sensor 245, and the APC valve 244 is feedback-controlled based on the measured pressure information. The vacuum pump 246 is always kept in an operative state at least until a process on the wafers 200 is terminated.

Further, the wafers 200 within the process chamber 201 are heated by the heater 207 to a desired film forming temperature. Here, current applying conditions to the heater 207 is feedback-controlled based on the temperature information detected by the temperature sensor 263 in order to keep a desired temperature distribution in the interior of the process chamber 201. When the wafers 200 in the process chamber 201 are heated to the film forming temperature, the inner wall of the reaction tube 203, the surfaces and interiors of the nozzles 249a and 249b, the surface of the boat 217 and so on are also heated to the film forming temperature. Such heating the interior of the process chamber 201 by the heater 207 is continuously performed at least until a process on the wafers 200 is terminated.

Further, the boat 217 and wafers 200 begin to rotate by the rotary mechanism 267. The rotation of the boat 217 and wafers 200 by the rotary mechanism 267 is continuously performed at least until a process on the wafers 200 is terminated.

(SiCN Film Forming Process)

Thereafter, the following three steps, i.e., Steps 1 to 3 are sequentially executed.

[Step 1]

(Supply of DCS Gas)

The valve 243a is opened to flow a DCS gas into the gas supply pipe 232a. A flow rate of the DCS gas is controlled by the MFC 241a, and the DCS gas is supplied from the nozzle 249a heated to the film forming temperature into the process chamber 201 and is exhausted through the exhaust pipe 231. In this way, the DCS gas is supplied to the wafer 200. At this time, the valve 243e is opened to allow a $N_2$ gas to flow into the gas supply pipe 232e. A flow rate of the $N_2$ gas is controlled by the MFC 241e, and the $N_2$ gas is supplied into the process chamber 201 together with the DCS gas and is exhausted through the exhaust pipe 231.

Further, in order to prevent infiltration of the DCS gas into the nozzles 249b, the valve 243f is opened to flow the $N_2$ gas into the gas supply pipe 232f. The $N_2$ gas is supplied into the process chamber 201 through the gas supply pipe 232b and the nozzle 249b and is exhausted through the exhaust pipe 231.

At this time, the APC valve 244 is appropriately controlled to set the internal pressure of the process chamber 201 to fall within a range of, for example, 1 to 2666 Pa. In some embodiments, the internal pressure of the process chamber 201 may range from 67 to 1333 Pa. A supply flow rate of the DCS gas controlled by the MFC 241a ranges from, for example, 1 to 2000 sccm, and in some embodiments, 10 to 1000 sccm. A supply flow rate of each of the $N_2$ gases controlled by the MFC 241e and 241f may fall within a range of, for example, 100 to 10000 sccm. A time duration for which the DCS gas is supplied to the wafer 200, i.e., a gas supply time (irradiation time), may fall within a range of, for example, 1 to 120 seconds, and in some embodiments, 1 to 60 seconds. The temperature of the heater 207 may be set such that a temperature of the wafers 200 may fall within a range, e.g., from 250 to 700 degrees C., in some embodiments, from 300 to 650 degrees C., and in some embodiments, from 350 to 600 degrees C.

If a temperature of the wafer 200 is lower than 250 degrees C., it may be difficult for DCS to be chemically adsorbed onto the wafer 200. In this case, it may result in a failure of obtaining a practical film formation rate. This can be resolved by setting the temperature of the wafer 200 to 250 degrees C. or more. By setting the temperature of the wafer 200 to 300 degrees C. or more or further 350 degrees C. or more, DCS can be more sufficiently adsorbed onto the wafer 200, thereby obtaining a more sufficient film formation rate.

If the temperature of the wafer 200 exceeds 700 degrees C., a CVD reaction is strengthened (a gaseous reaction is predominant), so that the film thickness uniformity easily deteriorates and it is difficult to control the uniformity. If the temperature of the wafer 200 is set to 700 degrees C. or less, the deterioration of film thickness uniformity can be prevented and the control of the uniformity can be available. In particular, if the temperature of the wafer 200 is set to 650 degrees C. or less or further 600 degrees C., a surface reaction becomes predominant, whereby the film thickness uniformity can be easily secured and it is easier to control the film thickness uniformity.

Accordingly, the temperature of the wafer 200 may be set to fall within a range of 250 to 700 degrees C., in some embodiments, 300 to 650 degrees C., and in some embodiments, 350 to 600 degrees C.

Under the foregoing conditions, the DCS gas is supplied to the wafer 200 to form a Si-containing layer which contains Cl and has a thickness ranging, e.g., from less than one atomic layer to several atomic layers, on the wafer 200 (a base film of the surface) as a first layer. The Si-containing layer containing Cl may include either or both of a silicon layer containing Cl and an adsorption layer of the DCS gas.

A Cl-containing Si layer collectively refers to layers including a Cl-containing continuous layer formed of Si, a Cl-containing discontinuous layer formed of Si, or a Cl-containing silicon thin film formed by overlapping the continuous layer and the discontinuous layer. The Cl-containing continuous layer formed of Si may be referred to as a Cl-containing Si thin film. Si constituting the Cl-containing Si layer includes Si whose bonding to Cl is not completely broken and Si whose bonding to Cl is completely broken.

The adsorption layer of the DCS gas includes a continuous adsorption layer of molecules of the DCS gas and a discontinuous adsorption layer thereof. That is, the adsorption layer of the DCS gas includes an adsorption layer having a thickness equal to or less than one molecular layer formed of DCS molecules. The DCS molecule constituting the adsorption layer of the DCS gas includes a molecule in which an Si—Cl bonding is partially broken. That is, the adsorption layer of the DCS gas includes a physisorption layer of DCS gas, a chemisorption layer of DCS gas, or both thereof.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing Cl may include both the Cl-containing Si layer and the adsorption layer of the DCS gas. However, as described above, the Si-containing layer containing Cl will be represented by the expression of "one atomic layer", "several atomic layers" or the like.

Under a condition in which the DCS gas is self-decomposed (pyrolyzed), i.e., under a condition in which a pyrolysis reaction of the DCS gas occurs, Si is deposited on the wafer 200 to form an Cl-containing Si layer. Under a condition in which the DCS gas is not self-decomposed (not pyrolyzed), i.e., under a condition in which a pyrolysis reaction of the DCS gas does not occur, the DCS gas is adsorbed onto the wafer 200 to form the adsorption layer of the DCS gas. In some embodiments, forming the Cl-containing Si layer on the wafer 200 is more desirable than forming the adsorption layer of the DCS gas on the wafer 200, in order to secure a higher film forming rate.

When the thickness of the first layer formed on the wafer 200 exceeds several atomic layers, an effect of a modification reaction in Steps 3 described later does not reach the entire first layer. In addition, a minimum value of the thickness of the first layer that can be formed on the wafer 200 is less than one atomic layer. Accordingly, the thickness of the first layer ranges from less than one atomic layer to several atomic layers in some embodiments. When the thickness of the first layer is one atomic layer or less, i.e., one atomic layer or less than one atomic layer, an effect of the modification reaction in Step 3 described later can be relatively increased, and a time required for the modification reaction in Step 3 can be reduced. A time required for forming the first layer in Step 1 can also be reduced. As a result, a processing time per one cycle can be reduced, and a total processing time can also be reduced. That is, the film forming rate can be increased. In addition, when the thickness of the first layer is one atomic layer or less, it may become easier to control the film thickness uniformity.

(Residual Gas Removal)

After the first layer is formed, the valve 243a is closed to stop the supply of the DCS gas. At this time, while the APC valve 244 is opened, the interior of the process chamber 201 is evacuated by the vacuum pump 246, and the residual gas remaining in the process chamber 201 such as an unreacted DCS gas or a DCS gas remaining after forming the first layer, is removed out of the process chamber 201. At this time, while the valves 243e and 243f are opened, the supply of the $N_2$ gas into the process chamber 201 is maintained. The $N_2$ gas acts as a purge gas, and thus, the residual gas remaining in the process chamber 201 can be effectively removed from the process chamber 201.

At this time, the residual gas remaining in the process chamber 201 may not completely be removed, and the interior of the process chamber 201 may not completely be purged. When the residual gas remaining in the process chamber 201 is very small in amount, there may be no harmful effect on the subsequent Step 2. Here, a flow rate of the $N_2$ gas supplied into the process chamber 201 need not be high. For example, if approximately the same amount of the $N_2$ gas as the volume of the reaction tube 203 (the process chamber 201) is supplied, the purging process can be performed without a harmful effect on Step 2. As described above, since the interior of the process chamber 201 is not completely purged, the purge time can be reduced and the throughput can be improved. In addition, the consumption of the $N_2$ gas can be restricted to a required minimal amount.

Examples of the precursor gas may include an inorganic precursor gas such as a monochlorosilane ($SiH_3Cl$, abbreviation: MCS) gas, a hexachlorodisilane ($Si_2Cl_6$, abbreviation: HCDS) gas, a tetrachlorosilane, i.e., silicon tetrachloride ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane ($SiH_4$, abbreviation: MS) gas, or the like, and an organic precursor gas such as a tetrakis(dimethylamino) silane ($Si[N(CH_3)_2]_4$, abbreviation: 4DMAS) gas, a tris (dimethylamino)silane ($Si[N(CH_3)_2]_3H$, abbreviation: 3DMAS) gas, a bis(diethylamino)silane ($Si[N(C_2H_5)_2]_2H_2$, abbreviation: 2DEAS) gas, or a bis(tert-butylamino)silane ($SiH_2[NH(C_4H_9)]_2$, abbreviation: BTBAS) gas, or the like, in addition to the DCS gas. When the precursor gas containing Cl is used, a precursor containing fewer Cl in the composition formula (in one molecule), such as a DCS gas or a MCS gas may be used. Examples of the inert gas may include rare gases such as an Ar gas, a He gas, a Ne gas, a Xe gas, and the like, in addition to the $N_2$ gas.

[Step 2]

(Supply of $C_3H_6$ Gas)

After Step 1 is terminated, a $C_3H_6$ gas is supplied to the wafer 200 in the process chamber 201.

In this step, the $C_3H_6$ gas is flown from the gas supply pipe 232b and opening/closing of the valves 243b, 243e and 243f is controlled in the same manner as opening/closing of the valves 243a, 243e and 243f is controlled in Step 1. The $C_3H_6$ gas is supplied from the nozzle 249b heated to the film forming temperature into the process chamber 201. A supply flow rate of the $C_3H_6$ gas controlled by the MFC 241b is set to fall within a range of, for example, 100 to 10000 sccm. The internal pressure of the process chamber 201 is set to fall within a range of, for example, 1 to 5000 Pa, and in some embodiments, 1 to 4000 Pa. A partial pressure of the $C_3H_6$ gas in the process chamber 201 is set to fall within a range of, for example, 0.01 to 4950 Pa. A time duration for which the $C_3H_6$ gas is supplied to the wafer 200, i.e., a gas supply time (irradiation time), may fall within a range of, for example, 1 to 200 seconds, in some embodiments, 1 to 120 seconds, and in some embodiments, 1 to 60 seconds. Other processing conditions are the same as those of Step 1.

When the $C_3H_6$ gas is supplied to the wafer 200 under the foregoing conditions, a C-containing layer having a thickness less than one atomic layer, i.e., a discontinuous C-containing layer, is formed on a surface of the first layer (the Si-containing layer containing Cl) formed on the wafer 200. The C-containing layer may include a C layer, a chemisorption layer of the $C_3H_6$ gas, or both thereof. In addition, in order to ensure a reaction of a $NH_3$ gas with the first layer including the C-containing layer in Step 3 described later, i.e., to ensure that a silicon carbonitride layer (SiCN layer) is formed, the supply of the $C_3H_6$ gas may be stopped before an adsorption reaction of molecules of the $C_3H_6$ gas onto the surface of the first layer is saturated, i.e., before the C-containing layer such as the $C_3H_6$ gas adsorption layer (chemisorption layer) formed on the surface of the first layer becomes a continuous layer (i.e., while the C-containing layer is a discontinuous layer).

(Residual Gas Removal)

After the C-containing layer is formed on the surface of the first layer, the valve 243b is closed to stop the supply of the $C_3H_6$ gas. At this time, a similar purging process as Step 1 is performed. That is, the residual gas remaining in the process chamber 201 such as an unreacted $C_3H_6$ gas or a $C_3H_6$ gas remaining after forming the C-containing layer, and reaction by-products, are removed from the process chamber 201. At this time, as in Step 1, the residual gas remaining in the process chamber 201 may not completely be removed.

Examples of the carbon-containing gas may include hydrogen carbide-based gases such as an acetylene ($C_2H_2$) gas and an ethylene ($C_2H_4$) gas, in addition to the $C_3H_6$ gas.

[Step 3]

(Supply of $NH_3$ Gas)

After Step 2 is terminated, a $NH_3$ gas is supplied to the wafer 200 in the process chamber 201.

In this step, the $NH_3$ gas is flown from the gas supply pipe 232b and opening/closing of the valves 243b, 243e and 243f is controlled in the same manner as opening/closing of the valves 243b, 243e and 243f is controlled in Step 2. The $NH_3$ gas is supplied from the nozzle 249b heated to the film forming temperature into the process chamber 201. A supply flow rate of the $NH_3$ gas controlled by the MFC 241b is set to fall within a range of, for example, 100 to 10000 sccm. The internal pressure of the process chamber 201 is set to fall within a range of, for example, 1 to 4000 Pa, and in some embodiments, 1 to 3000 Pa. A partial pressure of the $NH_3$ gas in the process chamber 201 is set to fall within a range of, for example, 0.01 to 3960 Pa. By setting the internal pressure of the process chamber 201 to such a relatively large pressure range, the $NH_3$ gas can be thermally activated by heat in a non-plasma state. If the $NH_3$ gas activated by heat is used in supplying a $NH_3$ gas, a relatively soft reaction can occur and nitriding described later can be performed more softly. A time duration for which the $NH_3$ gas activated by heat is supplied to the wafer 200, i.e., a gas supply time (irradiation time), may fall within a range of, for example, 1 to 120 seconds, and in some embodiments, 1 to 60 seconds. Other processing conditions are the same as those of Step 1.

Under the foregoing conditions, the $NH_3$ gas is supplied to the wafer 200, so that at least a portion of the first layer having the C-containing layer is modified. As the first layer having the C-containing layer is modified, a second layer containing Si, C and N, i.e., an SiCN layer, is formed on the wafer 200. When the second layer is formed, impurities such as Cl and so on contained in the first layer having the C-containing layer compose a gaseous material containing at least Cl in the modifying reaction by the $NH_3$ gas and are discharged out of the process chamber 201. That is, the impurities such as Cl and so on contained in the first layer having the C-containing layer are withdrawn or desorbed from the first layer having the C-containing layer, and finally separated from the first layer having the C-containing layer. Thus, the second layer has fewer impurities such as Cl than the first layer having the CC-containing layer.

(Residual Gas Removal)

After the second layer is formed, the valve 243b is closed to stop the supply of the $NH_3$ gas. At this time, a purge process similar to that of Step 1 is performed. That is, the residual gas remaining in the process chamber 201 such as unreacted $NH_3$ gas or a $NH_3$ gas remaining after forming the second layer, and reaction by-products, are removed from the process chamber 201. At this time, as in Step 1, the residual gas remaining in the process chamber 201 may not completely be removed.

Examples of the nitrogen-containing gas may include hydrogen nitride-based gases such as a diazene ($N_2H_2$) gas, a hydrazine ($N_2H_4$) gas, a $N_3H_8$ gas, and the like, and gases containing compounds thereof, in addition to the $NH_3$ gas. Examples of the inert gas may include rare gases such as an Ar gas, a He gas, a Ne gas, a Xe gas, and the like, in addition to the $N_2$ gas.

(Performing Predetermined Number of Times)

When a cycle in which the Steps 1 to 3 mentioned above are not performed simultaneously is performed once or more (a predetermined number of times), the SiCN film having a predetermined composition and a predetermined film thickness can be formed on the wafer 200. In some embodiments, the above-mentioned cycle is repeated multiple times. That is, in some embodiments, a thickness of the SiCN layer formed per cycle is set to be smaller than a desired film thickness and the foregoing cycle is repeated multiple times until a desired film thickness is obtained.

In performing the cycle multiple times, the expression of "a predetermined gas is supplied to the wafer 200" in each step of at least the second cycle and subsequent cycles thereof means that "a predetermined gas is supplied to a layer formed on the wafer 200, i.e., on the uppermost surface of the wafer 200 as a laminated body", and the expression of "a predetermined layer is formed on the wafer 200" means that "a predetermined layer is formed on a layer formed on the wafer 200, i.e., on the uppermost surface of the wafer 200 as a laminated body." This is the same as described above. This is equally applied to other embodiments described later.

(Purging and Returning to Atmospheric Pressure)

The valves 243e and 243f are opened to supply the $N_2$ gas from the gas supply pipes 232e and 232f, respectively, into the process chamber 201 and the $N_2$ gas is exhausted through the exhaust pipe 231. The $N_2$ gas acts as a purge gas. Thus, the interior of the process chamber 201 is purged with the inert gas and the residual gas remaining in the process chamber 201 and reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unloading and Wafer Discharging)

The seal cap 219 is descended by the boat elevator 115 to open the lower end of the manifold 209. The processed wafers 200 are unloaded to the outside of the reaction tube 203 through the lower end of the manifold 209, being supported by the boat 217 (boat unloading). Then, the processed wafers 200 are discharged from the boat 217 (wafer discharging).

(3) Cleaning Process

When the above-described film forming process is performed, deposits such as a thin film including the SiCN film are accumulated on the inner wall of the reaction tube 203, the surfaces of the nozzles 249a and 249b, the surface of the boat 217 and so on. That is, this deposits such as a thin film are adhered and accumulated on surfaces of members in the process chamber 201 heated to the film forming temperature. In addition, the deposits are adhered and accumulated on the interiors of the nozzles 249a and 249b heated to the film forming temperature. A cleaning process is performed before an amount of these deposits (thickness of a film including the deposits) reaches a predetermined amount (thickness) which is a value before the deposits start peeling-off or dropping.

The cleaning process includes: supplying a fluorine-based gas from the nozzle 249a as a first nozzle heated to a first temperature and a nitrogen oxide-based gas from the nozzle 249b as a second nozzle heated to the first temperature into the process chamber 201 heated to the first temperature in order to remove deposits including a SiCN film deposited on surfaces of members in the process chamber 201 by a thermochemical reaction (Cleaning Step 1); changing the internal temperature of the process chamber 201 to a second temperature higher than the first temperature (Temperature Rising Step); supplying a fluorine-based gas from the nozzle 249a heated to the second temperature into the process chamber 201 heated to the second temperature in order to remove substances remaining on the surfaces of the members in the process chamber 201 after removing the deposits and to remove deposits deposited in the nozzle 249a by the thermochemical reaction (Cleaning Step 2); and supplying a fluorine-based gas from the nozzle 249b heated to the second temperature into the process chamber 201 heated to the second temperature in order to remove substances remaining on the surfaces of the members in the process chamber 201 after removing the deposits and to remove deposits deposited in the nozzle 249b by the thermochemical reaction (Cleaning Step 3).

Figure 5A:
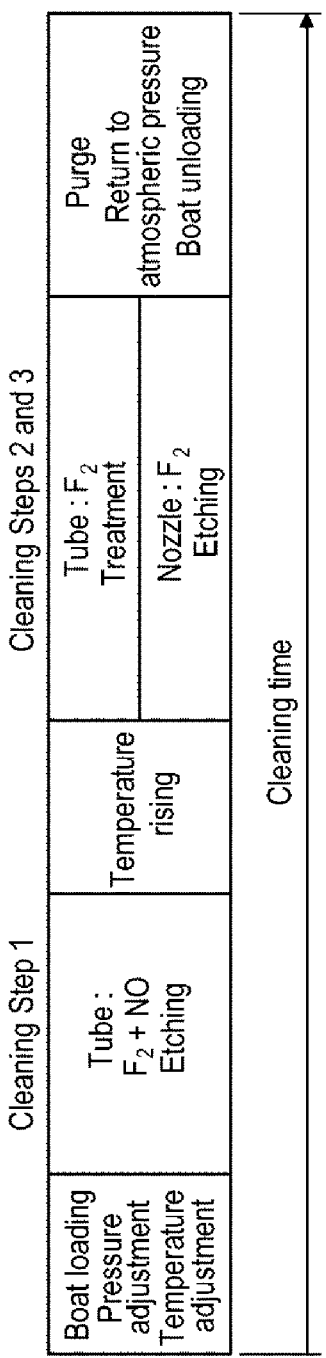
FIG. 5A is a flow diagram of a cleaning sequence according to one embodiment of the present disclosure.

Hereinafter, one example of the cleaning process using a $F_2$ gas as the fluorine-based gas, a NO gas as the nitrogen oxide-based gas, and a $N_2$ gas as an inert gas will be described with reference to FIG. 5A. In the following description, operations of various parts constituting the substrate processing apparatus are controlled by the controller 121. In FIG. 5A, "Etching" represents a deposit removing process to be described later and "Treatment" represents a treatment process to be described later. This is equally applied to FIGS. 5B and 5C.

(Boat Loading)

An empty boat 217 with no wafer 200 loaded therein is lifted by the boat elevator 115 to be transferred into the process chamber 201 (boat loading). In this state, the seal cap 219 seals the lower end portion of the manifold 209 with the 0 ring 220b interposed therebetween.

(Pressure Adjustment and Temperature Adjustment)

The interior of the process chamber 201 is vacuum-exhausted by the vacuum pump 246 to a first pressure. Further, the interior of the process chamber 201 is heated by the heater 207 to a first temperature. When the interior of the process chamber 201 is heated to the first temperature, the inner wall of the reaction tube 203, the surfaces and interiors (inner walls) of the nozzles 249a and 249b, the surface of the boat 217 and so on are heated to the first temperature. Once the internal pressure and temperature of the process chamber 201 reach the first pressure and the first temperature, respectively, control is made to keep the first pressure and the first temperature until Cleaning Step 1 described below is terminated. Next, the boat 217 begins to be rotated by the rotary mechanism 267. The boat 217 is continuously rotated by the rotary mechanism 267 until Cleaning Step 3 described later is terminated. However, the boat 217 may not be rotated.

(Cleaning Step 1)

In a state where the internal temperature and pressure of the process chamber 201 maintained respectively at the first temperature and the first pressure, the $F_2$ gas is supplied from the nozzle 249a heated to the first temperature into the process chamber 201 and the NO gas is supplied from the nozzle 249b heated to the first temperature into the process chamber 201.

In this step, the $F_2$ gas is flown from the gas supply pipe 232c while the NO gas is flown from the gas supply pipe 232d. At this time, the $N_2$ gas may be flown from the gas supply pipes 232e and 232f to dilute the $F_2$ gas and the NO gas in the gas supply pipes 232a and 232b, respectively. By controlling a supply flow rate of the $N_2$ gas, concentrations of the $F_2$ gas and the NO gas supplied into the process chamber 201 can be controlled.

The $F_2$ gas and the NO gas supplied into the process chamber 201 are mixed and react with each other in the process chamber 201, whereby active species such as a nitrosyl fluoride (FNO) are generated. At this time, a supply flow rate of the $F_2$ gas controlled by the MFC 241c is set to a flow rate enabling some of the $F_2$ gas supplied into the process chamber 201 to remain, being not consumed by the reaction. In addition, a supply flow rate of the NO gas controlled by the MFC 241d is set to a flow rate enabling most or all of the NO gas supplied into the process chamber 201 to be consumed. As a result, a mixture gas by the $F_2$ gas and the FNO gas, i.e., a mixture gas formed of the $F_2$ gas left without being consumed by the reaction and the FNO gas added thereto (a gas containing little or no NO gas) is generated in the process chamber 201 as a cleaning gas.

When the generated mixture gas passes through the interior of the process chamber 201 and is exhausted from the exhaust pipe 231, this gas contacts members in the process chamber 201, for example, the inner wall of the reaction tube 203, the surfaces of the nozzles 249a and 249b, the surface of the boat 217 and so on. At this time, deposits adhered to the members in the process chamber 201 are removed by a thermochemical reaction. That is, the deposits are removed by an etching reaction between the mixture gas obtained by adding FNO to the $F_2$ gas and the deposits. In addition, since FNO acts to promote the etching reaction by the $F_2$ gas, the FNO can increase an etching rate and enhance a cleaning action. Thus, the process conditions such as the internal temperature and pressure of the process chamber 201 can be set to a lower temperature and lower pressure condition.

In addition, in this step, the $F_2$ gas and the NO gas are supplied using the respective separate nozzles 249a and 249b. Since no NO gas is supplied into the nozzle 249a and only the $F_2$ gas or only the $F_2$ gas diluted with the $N_2$ gas exists in the nozzle 249a, no FNO is generated in the nozzle 249a. Accordingly, the above-described thermochemical reaction does not occur in the nozzle 249a. However, the $F_2$ gas alone may produce an etching reaction. In this case, under the first temperature, the etching reaction using the $F_2$ gas alone can be minimized and may be negligible as compared to the earlier-described etching reaction. In addition, since no $F_2$ gas is supplied into the nozzle 249b and only the NO gas or only the NO gas diluted with the $N_2$ gas exists in the nozzle 249b, no thermochemical reaction occurs in the nozzle 249b.

(Temperature Rising Step)

When Cleaning Step 1 is terminated with lapse of a preset process time, the interior of the process chamber 201 is vacuum-exhausted by the vacuum pump 246 to a second pressure. Further, the interior of the process chamber 201 is heated by the heater 207 to a second temperature. When the interior of the process chamber 201 is heated to the second temperature, the inner wall of the reaction tube 203, the surfaces and interiors (inner walls) of the nozzles 249a and 249b, the surface of the boat 217 and so on are heated to the second temperature. If the internal pressure and temperature of the process chamber 201 reach the second pressure and the second temperature, respectively, the second pressure and the second temperature are controlled such that the second pressure and temperature are maintained until Cleaning Step 3 described later is terminated.

The second pressure may be equal to the first pressure in some embodiments. That is, when Cleaning Step 1 is changed to Cleaning Step 2, the internal pressure of the process chamber 201 may remain equal to the first pressure without being changed in some embodiments. When the second pressure is equal to the first pressure, a process of changing the internal pressure of the process chamber 201 to the second pressure is unnecessary.

In addition, the second temperature is set to be higher than the first temperature. That is, when Cleaning Step 1 is changed to Cleaning Step 2, the internal temperature of the process chamber 201 is changed to a temperature higher than the first temperature.

Further, in this step, the valves 243c to 243f may be closed to stop the supply of the $F_2$ gas, the NO gas and the $N_2$ gas into the process chamber 201 and at least one of the valves 243c to 243f may be opened to continue the supply of at least one of the $F_2$ gas, the NO gas or the $N_2$ gas into the process chamber 201. The valves 243a and 243b remain closed, as in Cleaning Steps 1 and 2.

(Cleaning Step 2)

Subsequently, in a state where the internal temperature and pressure of the process chamber 201 maintained respectively at the second temperature and the second pressure, the $F_2$ gas is flown from the gas supply pipe 232c and is continuously supplied from the nozzle 249a heated to the second temperature into the process chamber 201. At this time, the $N_2$ gas may be flown from the gas supply pipe 232e to dilute the $F_2$ gas in the gas supply pipe 232a.

At this time, the $N_2$ gas is supplied from the nozzle 249b instead of supplying the NO gas. That is, in this step, as shown in FIG. 5A, only the $F_2$ gas or only the $F_2$ gas diluted with the $N_2$ gas is supplied into the process chamber 201 as a cleaning gas, so that no FNO is generated in the process chamber 201. At this time, it is possible not to supply the $N_2$ gas through the nozzle 249b. However, if the $N_2$ gas is supplied through the nozzle 249b, the $F_2$ gas infiltrating into the nozzle 249b can be prevented.

The supply of the $F_2$ gas or the $F_2$ gas diluted with the $N_2$ gas into the process chamber 201 heated to the second temperature removes, by the thermochemical reaction, substances remaining on the surfaces of the members in the process chamber 201 after removing the deposits in Cleaning Step 1, whereby a treatment process is provided to the surfaces of the members in the process chamber 201.

For example, quartz cracks occurred on surfaces of quartz members such as the inner wall of the reaction tube 203, the surfaces of the nozzles 249a and 249b, the surface of the boat 217 and so on, are removed. That is, the quartz cracks occurred on the quartz members are etched and removed (eliminated) by the $F_2$ gas supplied into the process chamber 201. In addition, for example, minute quartz powders, which are generated due to quartz cracks, etc., and adhered to the surfaces of the members in the process chamber 201, are etched and removed by the $F_2$ gas supplied into the process chamber 201. In addition, for example, deposits such as a residual film of SiCN or the like is etched and removed by the $F_2$ gas supplied into the process chamber 201.

At this time, the surfaces of the quartz members in the process chamber 201 after the deposit removal are slightly etched to be smoothed. For example, the inner wall of the reaction tube 203, the surfaces of the nozzles 249a and 249b, the surface of the boat 217 and the like after the deposit removal, are slightly etched to be smoothed. The etching of the surfaces of the quartz members may be an etching as slight as at least quartz cracks are removed, and is required not to reach an excessive etching (i.e., an over-etching). With process conditions to be described later, it is possible to avoid the over-etching to the surfaces of the quartz members and to perform a proper etching to the surfaces of the quartz members.

In addition, by supplying the $F_2$ gas or the $F_2$ gas diluted with the $N_2$ gas into the nozzle 249a heated to the second temperature, the deposits adhered to the interior of the nozzle 249a through the film forming process are removed by the thermochemical reaction. That is, the deposits adhered to the inner wall of the nozzle 249a by the film forming process are etched by the $F_2$ gas supplied into the nozzle 249a heated to the second temperature and are removed from the interior of the nozzle 249a. In addition, when the $F_2$ gas is alone used under the second temperature, a sufficient etching reaction occurs.

In addition, at this time, since no $F_2$ gas is supplied or infiltrates into the nozzle 249b, the above-described thermochemical reaction, i.e., the deposit etching reaction, does not occur in the nozzle 249b.

(Cleaning Step 3)

When Cleaning Step 2 is terminated after a preset process time, the valve 243c is closed to stop the supply of the $F_2$ gas into the process chamber 201. Then, in a state where the internal temperature and pressure of the process chamber 201 maintained respectively at the second temperature and the second pressure, the $F_2$ gas is flown from the gas supply pipe 232d and is continuously supplied through the nozzle 249b heated to the second temperature into the process chamber 201. At this time, the $N_2$ gas may be flown through the gas supply pipe 232f to dilute the $F_2$ gas in the gas supply pipe 232b.

At this time, the $N_2$ gas is supplied from the nozzle 249a instead of supplying the NO gas. That is, in this step, like Cleaning Step 2, only the $F_2$ gas or only the $F_2$ gas diluted with the $N_2$ gas is supplied as a cleaning gas into the process chamber 201 and no FNO is generated in the process chamber 201. At this time, it is possible not to supply the $N_2$ gas through the nozzle 249a. However, if the $N_2$ gas is supplied through the nozzle 249a, the $F_2$ gas infiltrating into the nozzle 249a can be prevented.

By supplying the $F_2$ gas or the $F_2$ gas diluted with the $N_2$ gas into the process chamber 201 heated to the second temperature, the surfaces of the members in the process chamber 201 continue to be subjected to the above-described treatment process.

In addition, by supplying the $F_2$ gas or the $F_2$ gas diluted with the $N_2$ gas into the nozzle 249b heated to the second temperature, the deposits adhered to the interior of the nozzle 249b during the film forming process are removed by the thermochemical reaction. That is, the deposits adhered to the inner wall of the nozzle 249b during the film forming process are etched by the $F_2$ gas supplied into the nozzle 249b heated to the second temperature and are removed from the interior of the nozzle 249b.

In addition, at this time, since no $F_2$ gas is supplied or infiltrates into the nozzle 249a, the above-described thermochemical reaction, i.e., the etching reaction to the inner wall of the nozzle 249a does not occur in the nozzle 249a.

(Purging and Returning to Atmospheric Pressure)

When Cleaning Step 3 is terminated after a preset process time, the valve 243d is closed to stop the supply of the $F_2$ gas into the process chamber 201. Then, the valve 243e and 243f are opened to flow the $N_2$ gas through the gas supply pipes 232e and 232f, respectively, into the process chamber 201 and the $N_2$ gas is exhausted through the exhaust pipe 231. The $N_2$ gas acts as a purge gas. Thus, the interior of the process chamber 201 is purged. Thereafter, the atmosphere in the process chamber 201 is substituted with the $N_2$ gas (inert gas substitution), and the internal pressure of the process chamber 201 returns to normal pressure (return to atmospheric pressure).

(Boat Unloading)

The seal cap 219 is descended by the boat elevator 115 to open the lower end of the manifold 209. The empty boat 217 is transferred through the lower end of the manifold 209 out of the reaction tube 203 (boat unloading). When these series of steps are terminated, the earlier-described film forming process is resumed.

(4) Modifications of Cleaning Process

The cleaning process in this embodiment is not limited to the above-described forms but may be altered as the following modifications.

Modification 1

In Cleaning Step 1, the internal pressure of the process chamber 201 may be allowed to vary by intermittently supplying at least one of the $F_2$ gas, the NO gas, or the $N_2$ gas into the process chamber 201, for example, via repeating an opening/closing operation of at least one of the valves 243c, 243d, 243e and 243f. When the internal pressure of the process chamber 201 varies, the deposits in the process chamber 201 can be subjected to a shock caused by the pressure variation and etching can be performed to the deposits while causing a crack or peeling-off of the deposits. As a result, efficiency of removal of the deposits from the interior of the process chamber 201 can be increased.

Modification 2

In Cleaning Step 1, a step for supplying the $F_2$ gas and the NO gas into the process chamber 201 to be sealed in the process chamber 201, and a step for exhausting the interior of the process chamber 201 may be repeated, for example, via repeating an opening/closing operation of the APC valve 244.

In addition, in Cleaning Step 1, a step for supplying the $F_2$ gas and the NO gas into the process chamber 201 to be sealed in the process chamber 201, a step for maintaining a state in which the $F_2$ gas and the NO gas are sealed in the process chamber 201, and a step for exhausting the interior of the process chamber 201 may be repeated.

In this case, the internal pressure of the process chamber 201 can also vary to achieve the same effects as Modification 1.

In addition, if the $F_2$ gas and the NO gas are supplied to the process chamber 201 to be sealed in the process chamber 201, the $F_2$ gas and the NO gas can be prevented from being discharged from the process chamber 201 before FNO is generated. In addition, a time for which the $F_2$ gas and the NO gas stay in the process chamber 201, i.e., a reaction time required to generate the FNO, can be secured. This ensures the generation of FNO, which can result in enhancement of the above-described cleaning action. In addition, an amount of the cleaning gas discharged out of the process chamber 201 without contribution to the cleaning can be reduced, which can result in an increase in use efficiency of the cleaning gas and a decrease in costs of the cleaning process.

In addition, if the state where the $F_2$ gas and the NO gas are sealed in the process chamber 201 is maintained, the generation of FNO can be further secured and the cleaning action can be further enhanced. In addition, if the state in which the $F_2$ gas and the NO gas are sealed in the process chamber 201 is maintained, a $F_2$/FNO ratio to be described later can be easily adjusted to fall within a predetermined range. That is, controllability of the $F_2$/FNO ratio can be increased. In addition, the use efficiency of the cleaning gas can be further increased to further reduce costs of the cleaning process.

In addition, when the opening/closing operation of the APC valve 244 is performed in Cleaning Step 1, the APC valve 244 may alternately repeat its full closing operation and full opening operation. In addition, when the APC valve 244 is closed in Cleaning Step 1, an opening degree of the APC valve 244 may be controlled to establish a predetermined pressure (constant pressure) in the process chamber 201, instead of fully closing the APC valve 244. Further, when the APC valve 244 is opened in Cleaning Step 1, an opening degree of the APC valve 244 may be controlled to establish a predetermined pressure (constant pressure) in the process chamber 201, instead of fully opening the APC valve 244.

Modification 3

In Cleaning Step 2, when the $F_2$ gas is supplied via the nozzle 249a, the NO gas may be supplied through the nozzle

249b. At this time, the $N_2$ gas may be flown via the gas supply pipe 232f to dilute the NO gas in the gas supply pipe 232b.

In addition, in Cleaning Step 3, when the $F_2$ gas is supplied from the nozzle 249b, the NO gas may be supplied from the nozzle 249a. At this time, the $N_2$ gas may be flown from the gas supply pipe 232e to dilute the NO gas in the gas supply pipe 232a.

Figure 5B:
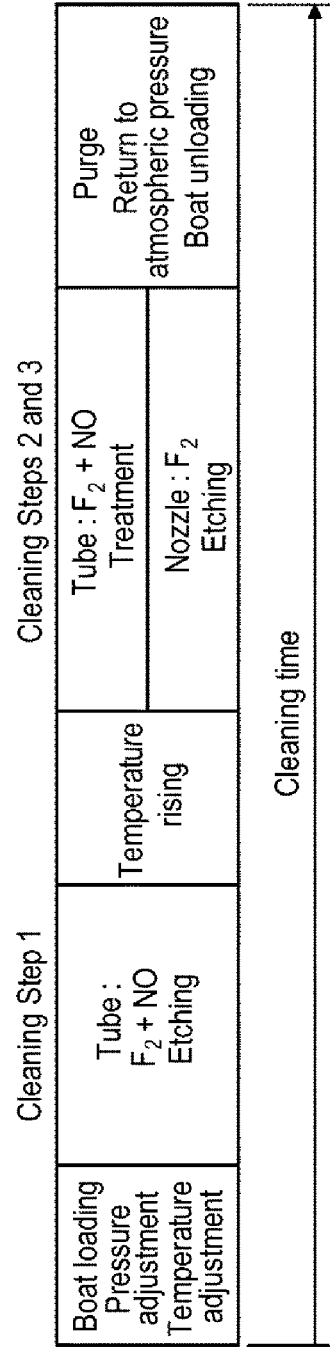
FIG. 5B is a flow diagram of a cleaning sequence according to another embodiment of the present disclosure.

That is, in at least one of Cleaning Steps 2 or 3, as illustrated in FIG. 5B, the $F_2$ gas and the NO gas, or the $F_2$ gas diluted with the $N_2$ gas and the NO gas may be supplied into the process chamber 201 to generate FNO in the process chamber 201. In this case, the treatment process in the process chamber 201 is performed using the mixture gas obtained by adding FNO to the $F_2$ gas. As a result, the etching reaction to the quartz members in the process chamber 201 can be further enhanced and the efficiency of the above-described treatment process is further improved.

Modification 4

For example, if no deposits are adhered to the interior of the nozzle 249b or if only a small amount of deposits are adhered to the interior of the nozzle 249b, Cleaning Step 3 may not be performed after performing Cleaning Step 2. This can shorten the total time required for the cleaning process, thereby increasing productivity. In addition, this can prevent an etching damage to the interior (i.e., the inner wall) of the nozzle 249b.

Modification 5

The order of performance of Cleaning Steps 2 and 3 may be interchanged. That is, Cleaning Step 3 may be first performed to clean the interior of the nozzle 249b and Cleaning Step 2 may be then performed to clean the interior of the nozzle 249a.

Modification 6

Instead of performing Cleaning Steps 2 and 3 sequentially (non-simultaneously), these steps may be performed in parallel (simultaneously). This can shorten the total time required for the cleaning process, thereby increasing productivity.

In this case, in some embodiments, the supply of the $F_2$ gas into a nozzle in which the cleaning is first terminated is stopped and then the $N_2$ gas is supplied. This can prevent the interior (i.e., the inner wall) of this nozzle from being over-etched.

In addition, when Cleaning Steps 2 and 3 are simultaneously performed, the concentrations of the $F_2$ gas supplied into the nozzles 249a and 249b may be respectively adjusted in order to terminate the cleaning in the nozzles 249a and 249b at the same time, i.e., to synchronize cleaning termination. That is, etching rates of deposits in the nozzles 249a and 249b may be controlled so that the cleanings in the nozzles 249a and 249b can be terminated simultaneously.

(5) Process Conditions in Cleaning Process

Hereinafter, process conditions of Cleaning Steps 1 to 3 will be described.
(Process Conditions in Cleaning Step 1)
Process conditions in Cleaning Step 1 may be set to conditions in which an etching rate of deposits including a thin film is higher than an etching rate of quartz members in the process chamber 201, in some embodiments.

In order to alleviate damage to the quartz members in the process chamber 201 while shortening a time required to remove the deposits adhered to the interior of the process chamber 201, a ratio of "a $F_2$ gas flow rate" to "a FNO flow rate" ($F_2$/FNO ratio) in a cleaning gas (mixture gas), i.e., a ratio of "a flow rate of $F_2$ gas remaining without being consumed by a reaction" to "a flow rate of FNO being generated by the reaction," to fall within a predetermined range. For example, the $F_2$/FNO ratio may fall between 0.5 or more and 2 or less, in some embodiments, between 0.5 or more and 1 or less, and in some embodiments, between 0.5 or more and 0.75 or less.

If the $F_2$/FNO ratio is less than 0.5, the etching rate of the deposits adhered to the interior of the process chamber 201 is likely to be lowered and etching selectivity of the deposits adhered to the interior of the process chamber 201 to the quartz members in the process chamber 201 (deposit etching rate/quartz member etching rate) is likely to deteriorate. That is, a time required to remove the deposits adhered to the interior of the process chamber 201 is lengthened and etching damage to the quartz members in the process chamber 201 is likely to increase. On the other hand, if the $F_2$/FNO ratio is 0.5 or more, the etching rate of the deposits adhered to the interior of the process chamber 201 can be sharply increased and the above-described etching selectivity can be also sharply increased. That is, a time required to remove the deposits adhered to the interior of the process chamber 201 can be shortened and damage to the quartz members in the process chamber 201 can be alleviated.

However, although, if the $F_2$/FNO ratio is 1 or more, the etching rate of the deposits adhered to the interior of the process chamber 201 can be increased, the above-described etching selectivity is likely to deteriorate. That is, although the time required to remove the deposits adhered to the interior of the process chamber 201 can be shortened, the etching damage to the quartz members in the process chamber 201 is likely to be increased. On the contrary, if the $F_2$/FNO ratio is less than 1, the etching rate of the deposits adhered to the interior of the process chamber 201 can be increased and the above-described etching selectivity can also be increased. That is, the time required to remove the deposits adhered to the interior of the process chamber 201 can be shortened and the etching damage to the quartz members in the process chamber 201 can also be alleviated. In addition, if the $F_2$/FNO ratio is 0.75 or less, the etching selectivity can be further increased and the etching damage to the quartz members in the process chamber 201 is likely to be further alleviated. If the $F_2$/FNO ratio exceeds 2, the etching selectivity falls below a practical level. When the $F_2$/FNO ratio is 2 or less, it is possible to bring the etching selectivity to the practical level.

The $F_2$/FNO ratio can be controlled by a ratio of the flow rates of the NO gas and the $F_2$ gas supplied into the process chamber 201, or the internal pressure and temperature of the process chamber 201.

For example, if the interior of the process chamber 201 is under temperature and pressure conditions in which a reaction of 100% of yield of the $F_2$ gas and the NO gas (conditions establishing the relation of $2NO+F_2 \rightarrow 2FNO$) and a ratio of the flow rates of gases supplied into the process chamber 201 has a relation of NO gas flow rate:$F_2$ gas flow rate=2:1, all of the $F_2$ gas supplied into the process chamber 201 is consumed by a reaction and, thus the $F_2$/FNO ratio becomes equal to 0. On the other hand, under the conditions enabling a reaction of 100% of yield, if the flow rate ratio of the $F_2$ gas is set to be higher than the above-described stoichiometric ratio NO gas flow rate:$F_2$ gas flow rate=2:1), some of the $F_2$ gas supplied into the process chamber 201 can remain unreacted and it is possible to increase the $F_2$/FNO ratio.

More specifically, under the conditions enabling a reaction of 100% of yield, assuming that NO gas flow rate:$F_2$ gas flow rate is 2:α, a relation of $2NO+\alpha F_2 \rightarrow 2FNO+(\alpha-1)F_2$ is established and the $F_2$/FNO ratio becomes $(\alpha-1)/2$. Therefore, under the conditions causing a reaction of 100% of yield, assuming that NO gas flow rate:$F_2$ gas flow rate is 2:2, the $F_2$/FNO ratio becomes 0.5. Assuming that NO gas flow rate:$F_2$ gas flow rate is 2:2.5, the $F_2$/FNO ratio becomes 0.75. Assuming that NO gas flow rate:$F_2$ gas flow rate is 2:3, the $F_2$/FNO ratio becomes 1.

In this way, if a relation between the value of the $F_2$/FNO ratio and the conditions of mixing the $F_2$ gas and the NO gas is obtained in advance, the $F_2$/FNO ratio can be controlled by controlling the conditions of mixing the $F_2$ gas and the NO gas. In addition, as described in Modification 2, by providing a step for maintaining a state in which the $F_2$ gas and the NO gas are sealed in the process chamber 201, controllability of the $F_2$/FNO ratio can be increased. This is because the efficiency of reaction of the $F_2$ gas and the NO gas can be increased due to maintaining a state in which the $F_2$ gas and the NO gas are sealed in the process chamber 201. This makes it possible to cause a reaction close to the reaction of 100% of yield.

The process conditions in Cleaning Step 1 may be exemplified as follows:

First temperature: less than 400 degrees C., and in some embodiments, 200 to 350 degrees C.
First pressure: 1330 Pa (10 Torr) to 101300 Pa (atmospheric pressure), and in some embodiments, 13300 Pa (100 Torr) to 53320 Pa (400 Torr)
$F_2$ gas flow rate: 0.5 to 5 slm
NO gas flow rate: 0.5 to 5 slm
$N_2$ gas flow rate: 1 to 20 slm
NO gas/$F_2$ gas flow rate ratio: 0.5 to 2.

The above-described etching process can be properly performed by setting each of the process conditions to a certain value in the respective range.

(Process Conditions in Cleaning Steps 2 and 3)

Process conditions in Cleaning Steps 2 and 3 may be set to conditions in which the etching of the quartz members in the process chamber 201 is further promoted, i.e., conditions in which an etching rate of quartz members becomes higher than the etching rate of quartz members in Cleaning Step 1, in some embodiments. That is, the process conditions in Cleaning Steps 2 and 3 may be set to conditions in which a treatment process of members in the process chamber 201 can be properly progressed. In addition, the process conditions in Cleaning Steps 2 and 3 may be set to conditions in which the deposits adhered to the interiors of the nozzles 249a and 249b can be properly etched and removed.

In Cleaning Steps 2 and 3, in order to further promote the etching to the quartz members, the second temperature may be set to be higher than the first temperature. At that time, the second pressure may be set to be lower than the first pressure. In addition, assuming that a flow rate ratio of NO gas to $F_2$ gas (NO/$F_2$ flow rate ratio) in Cleaning Step 1 is a first flow rate ratio, a flow rate ratio of NO gas to $F_2$ gas (NO/$F_2$ flow rate ratio) in Cleaning Step 2 is a second flow rate ratio, and a flow rate ratio of NO gas to $F_2$ gas (NO/$F_2$ flow rate ratio) in Cleaning Step 3 is a third flow rate ratio, the second and third flow rate ratios may be set to be smaller than the first flow rate ratio.

The first flow rate ratio may be a ratio at which the above-described $F_2$/FNO ratio can be realized. For example, the first flow rate ratio may be set to fall within a range of 0.5 or more to 2 or less. If the NO/$F_2$ flow rate ratio is below 0.5, an effect of adding the NO gas to the $F_2$ gas may be weakened to decrease an etching rate of deposits including a thin film. If the NO/$F_2$ flow rate ratio is above 2, the NO gas is excessively added to the $F_2$ gas, an etching rate of deposits including a thin film may be also decreased. Therefore, the first flow rate ratio may be set to a ratio at which the afore-mentioned $F_2$/FNO is realized and, for example, the first flow rate ratio may fall within the range of 0.5 or more to 2 or less.

The second and third flow rate ratios may be set to fall within a range of 0 or more to 1 or less, and in some embodiments, 0.05 or more to 1 or less. If the NO/$F_2$ flow rate ratio is above 1, the etching rate of the quartz members may be much high, whereby the quartz members may be unevenly etched. If the NO/$F_2$ flow rate ratio is 0, that is, even if only the $F_2$ gas or only the $F_2$ gas diluted with the $N_2$ gas is supplied into the process chamber 201, the quartz members can be properly etched. However, if the NO gas is added to the $F_2$ gas, the etching rate of the quartz members can be increased, where the effects are obtainable only when the NO/$F_2$ flow rate ratio is set to at least 0.05 or more. Therefore, the second and third flow rate ratios may be set to fall within the range of 0 or more to 1 or less, and in some embodiments, 0.05 or more to 1 or less. The case where the second and third flow rate ratios are 0 means that only the $F_2$ gas or only the $F_2$ gas diluted with the $N_2$ gas is supplied into the process chamber 201, as shown in FIG. 5A.

In addition, under the state where the second temperature is set to be higher than the first temperature, if the second pressure is controlled to be lower than the first pressure or the second and third flow rate ratio is controlled to be lower than the first flow rate ratio, the quartz members can be prevented from being locally and unevenly etched in Cleaning Steps 2 and 3. That is, even in the state where the etching of the quartz members was further promoted, the quartz members can be evenly etched. In addition, when the NO/$F_2$ flow rate ratio is changed from the first flow rate ratio to the second flow rate ratio, only the NO gas flow rate may be changed (decreased) with the $F_2$ gas flow rate unchanged (i.e., remaining constant). On the contrary, only the $F_2$ gas flow rate may be changed (increased) with the NO gas flow rate unchanged (i.e., remaining constant). Thus, the flow rate ratio changing (adjusting) operation can be simplified as compared to a case of changing both of the $F_2$ gas flow rate and the NO gas flow rate.

In addition, in Cleaning Steps 2 and 3, only the $F_2$ gas or only the $F_2$ gas diluted with the $N_2$ gas is flown into the nozzles 249a and 249b while no NO gas is flown into the nozzles 249a and 249b. If when only the $F_2$ gas or only the $F_2$ gas diluted with the $N_2$ gas is flown in this manner, only a slight etching reaction occurs in the nozzles 249a and 249b under the first temperature. On the other hand, under the second temperature set to be higher than the first temperature, even when only the $F_2$ gas or only the $F_2$ gas diluted with the $N_2$ gas is flown, a sufficient etching reaction occurs in the nozzles 249a and 249b. That is, in Cleaning Steps 2 and 3, since the second temperature is set to be higher than the first temperature, the deposits adhered to the interiors of the nozzles 249a and 249b can be properly etched and removed.

The process conditions in Cleaning Steps 2 and 3 may be exemplified as follows:
  Second temperature: 400 degrees C. or more, and in some embodiments, 400 to 500 degrees C.
  Second pressure: 1330 Pa (10 Torr) to 26600 Pa (200 Torr), and in some embodiments, 13300 Pa (100 Torr) to 19950 Pa (150 Torr)
  $F_2$ gas flow rate: 0.5 to 5 slm
  NO gas flow rate: 0.5 to 5 slm
  $N_2$ gas flow rate: 1 to 20 slm
  NO gas/$F_2$ gas flow rate ratio: 0 to 1, and in some embodiments, 0.05 to 1.

The treatment process of the surfaces of the members in the process chamber 201 and the cleaning process of the interiors of the nozzles 249a and 249b can be properly performed by setting each of the process conditions to a certain value in the respective range. Here, the case where the NO gas flow rate is 0 slm and the NO/$F_2$ flow rate ratio is 0 means that only the $F_2$ gas or only the $F_2$ gas diluted with the $N_2$ gas is supplied into the process chamber 201.

In addition, the process time of Cleaning Step 2 may be set to be longer than the process time of Cleaning Step 3. This is because the DCS gas is a gas containing an element (Si) which can be solidified for itself under the above-described process conditions, i.e., a gas which can deposit a film for itself. In addition, the $C_3H_6$ gas and the $NH_3$ gas are gases containing elements (C, N and H) which cannot be solidified for themselves under the above-described process conditions, i.e., gases which cannot deposit a film for themselves. Therefore, when the above-described film forming process is performed, deposits (mainly composed of Si) are more adhered to the nozzle 249a than the nozzle 249b. On the other hand, some deposits mainly composed of Si, SiN or the like are adhered to the interior of the nozzle 249b due to the DCS gas which slightly infiltrates into the nozzle 249b. By setting the process time of Cleaning Steps 2 and 3 as described above, etching damage (over-etching) to the interior (i.e., the inner wall) of the nozzle 249b can be avoided while reliably removing the deposits deposited within the nozzle 249a. In addition, the same effects can be obtained by setting the flow rate or concentration of the $F_2$ gas supplied in Cleaning Step 2 to be higher than the flow rate or concentration of the $F_2$ gas supplied in Cleaning Step 3.

(6) Effects of the Embodiment

According to this embodiment, one or more effects are provided as described below.

(a) In Cleaning Step 1, by using the $F_2$ gas and the NO gas, i.e., by using the mixture gas obtained by adding FNO to the $F_2$ gas, the etching rate of the deposits can be increased and the cleaning in the process chamber 201 can be progressed with high efficiency. In addition, in Cleaning Step 1, by using the $F_2$ gas and the NO gas, the cleaning in the process chamber 201 can be progressed at a practical speed even if the process conditions such as the internal temperature (first temperature) and internal pressure of the process chamber 201 are set to low temperature and low pressure conditions. As a result, etching damages to the quartz members in the process chamber 201 can be alleviated.

In addition, it was found that, in order to increase the etching rate of the deposits when only the $F_2$ gas is used as a cleaning gas, the internal temperature of the process chamber 201 is required to be relatively high, in which case the quartz members in the process chamber 201 is likely to be damaged. In addition, it was found that, when the FNO is alone used as a cleaning gas, it is difficult to progress the etching due to a low etching rate of the deposits. That is, it was found that, although the FNO gas may promote the etching reaction when being added to the $F_2$ gas, the FNO gas is difficult to progress the etching for itself.

(b) In Cleaning Step 1, by setting the internal temperature (first temperature) of the process chamber 201 to low temperature conditions, for example, 400 degrees C. or less, it is possible to prevent corrosion of metal members (low temperature members) in the process chamber 201 or in a gas distribution path, such as the manifold 209, the seal cap 219, the rotary shaft 255, the exhaust pipe 231, the APC valve 244 and so on. That is, it is possible to remove deposits formed on the metal members with a high etching rate while preventing the corrosion of the metal members (low temperature members).

(c) By setting the temperature (first temperature) in Cleaning Step 1 to a temperature within the above-described range of conditions and setting the $F_2$/FNO ratio in the mixture gas to a ratio within the above-described range, an etching selectivity of deposits and quartz can be increased. As a result, it is possible to prevent the quartz members in the process chamber 201 from being damaged by an uneven etching.

This is because, in reality, deposits may not be evenly adhered to the interior of the process chamber 201 having been subjected to the film forming process. For example, a film of the deposits may be locally thin or locally thick. In addition, the etching rate of the deposits may become locally different due to non-uniformity of the surface temperature of the inner wall of the process chamber 201 or non-uniformity of the pressure (concentration) of the cleaning gas in the process chamber 201. In this case, if all of the deposits adhered to the interior of the process chamber 201 are intended to be etched away, a surface of a firstly-exposed quartz member goes exposed to the cleaning gas for a long time and may be locally damaged. In order to alleviate such local damage, it is effective to increase the etching selectivity, as described above.

(d) As the nitrogen oxide-based gas, the NO gas can be used to increase efficiency of generation of FNO. In addition, as the nitrogen oxide-based gas, a nitrous oxide ($N_2O$) gas or a nitrogen dioxide ($NO_2$) gas may be used instead of the NO gas. However, in this case, since the $N_2O$ gas and the $NO_2$ gas are hard to react with the $F_2$ gas, a preliminary decomposition room dedicated for the $N_2O$ gas and the $NO_2$ gas needs to be installed in the gas supply pipes 232c and 232d. On the contrary, since the NO gas makes a sufficient reaction with the $F_2$ gas in the process chamber 201, there is no need to install a preliminary decomposition room dedicated for the NO gas. This can contribute to simplifying the structure of the substrate processing apparatus, which can result in reduced production costs.

(e) By setting the temperature (second temperature) in Cleaning Steps 2 and 3 to a temperature higher than the temperature (first temperature) in Cleaning Step 1, the above-described treatment process for members in the process chamber 201 can be properly performed only using the $F_2$ gas alone. By subjecting surfaces of quartz members such as the inner wall of the reaction tube 203, the side walls of the nozzles 249a and 249b, the surface of the boat 217 and so on, to the treatment process, an increase in an effective surface area of the interior of the process chamber 201 can be prevented. As a result, in a film forming process immediately after Cleaning Steps 1 to 3 are performed, it is possible to prevent a deposition rate of a film formed on the wafer 200 from being lowered. In addition, it is possible to prevent an occurrence of alien substances in the process chamber 201. In addition, this temperature allows deposits remaining in the process chamber 201 to be removed.

In addition, when the second temperature is set to, for example, 400 to 450 degrees C., the etching rate of the quartz members is equal to or slightly less than the etching rate of the deposits, at which the etching to the deposits can be sufficiently progressed. In addition, when the second temperature is set to, for example, 450 to 500 degrees C., the etching rate of the quartz members becomes higher than the etching rate of the deposits, wherein the surfaces of the quartz members in the process chamber 201 is allowed to be smoothed more quickly.

In addition, the quartz members in the process chamber 201 can be prevented from being locally and unevenly etched in Cleaning Steps 2 and 3 by controlling the second pressure to be lower than the first pressure or controlling the second and third flow rate ratios to be smaller than the first flow rate ratio, in a state where the second temperature is set to be higher than the first temperature.

In addition, as in Modification 3, when the mixture gas obtained by adding FNO to the $F_2$ gas is used in at least one of Cleaning Steps 2 and 3, the treatment process in the process chamber 201 can be more efficiently progressed.

(f) By setting the temperature (second temperature) in Cleaning Steps 2 and 3, i.e., the temperature of the interior of the nozzles 249a and 249b in Cleaning Steps 2 and 3, to a temperature within the range of the above-described conditions, which is higher than the first temperature, the cleaning process in the nozzles 249a and 249b can be properly progressed using the $F_2$ gas.

(g) In Cleaning Steps 2 and 3, since the treatment process for members in the process chamber 201 and the cleaning process in the nozzles 249a and 249b are performed in parallel (simultaneously), the total time required for the cleaning process (cleaning time) can be shortened. That is, the cleaning time can be shortened as compared to the conventional example where the treatment process in the process chamber and the cleaning process in the nozzles are performed sequentially (non-simultaneously), not in parallel, as illustrated in FIG. 5C.

(h) In Cleaning Steps 1 to 3, since a hydrogen-containing gas such as a HF gas, a $H_2$ gas or the like is not supplied into the process chamber 201, it is possible to suppress corrosion by HF in metal members in the process chamber 201 or in a gas distribution path and to suppress metal contamination in the process chamber 201. In addition, it is possible to prevent quartz members in the process chamber 201 from being eroded by the HF gas and from being damaged.

Other Embodiments of the Present Disclosure

The embodiments of the present disclosure have been described in detail. However, the present disclosure is not limited to the foregoing embodiments and its modifications but may be variously modified without departing from the spirit of the present disclosure.

An example in which the $C_3H_6$ gas and the $NH_3$ gas are supplied from the nozzle 249b has been illustrated in the above-described embodiment. The present disclosure is not limited thereto, and for example, the $C_3H_6$ gas may be supplied from the nozzle 249a.

Further, an example in which Steps 1 to 3 are not simultaneously performed in forming the SiCN film on the wafer has been illustrated in the above-described embodiment. The present disclosure is not limited thereto and, for example, Steps 1 to 3 may be simultaneously performed a predetermined number of times (n times). In this case, a film forming process can be also performed in the same process conditions as the above-described embodiment. In addition, the interior of the process chamber and the interiors of the nozzles can be cleaned with the same procedures and process conditions as the above-described embodiment.

In addition, for example, an example in which the interior of the process chamber and the interiors of the nozzles are cleaned after the SiCN film is formed on the wafer has been illustrated in the above-described embodiment. However, the present disclosure is not limited thereto.

For example, the above-described cleaning process can be properly applied to clean the interior of the process chamber and the interiors of the nozzles after forming a silicon-based insulating film, such as a silicon nitride film (SiN film), a silicon-rich SiN film, a silicon oxycarbonitride film (SiOCN film), a silicon oxycarbide film (SiOC film), a silicon oxynitride film (SiON film), a silicon borocarbonitride film (SiBCN film), a silicon boronitride film (SiBN film) or the like, on the wafer.

Figure 4B:
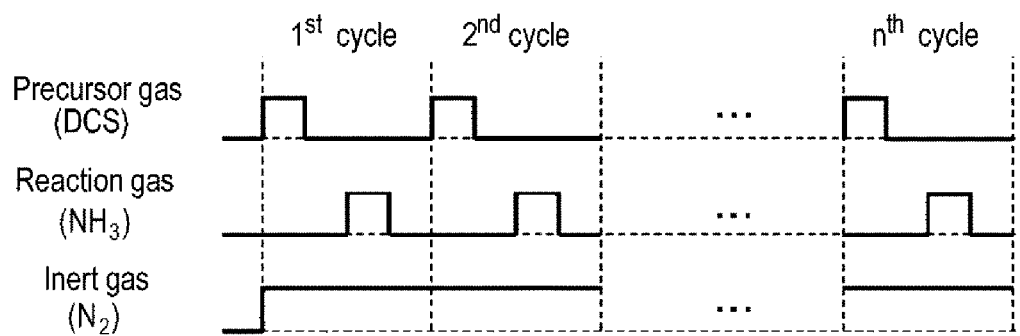

In addition, in forming the SiN film on the wafer, for example, as illustrated in FIG. 4B, a cycle in which the above-described Steps 1 and 3 are not performed simultaneously may be performed a predetermined number of times (n times). In addition, Steps 1 and 3 may be simultaneously performed a predetermined number of times (n times). Even in this case, the film forming process can be performed with the same process conditions as the above-described embodiment.

In addition, when the SiOCN film is formed on the wafer, for example, a cycle in which the above-described Steps 1 to 3 and a step for supplying an oxygen ($O_2$)-containing gas such as an oxygen ($O_2$) gas or the like are non-simultaneously or simultaneously performed may be performed a predetermined number of times (n times). In addition, when the SiOC film is formed on the wafer, for example, a cycle in which the above-described Steps 1 and 2 and a step for supplying an oxygen-containing gas are non-simultaneously or simultaneously performed may be performed a predetermined number of times (n times). In addition, when the SiON film is formed on the wafer, for example, a cycle in which the above-described Steps 1 and 3 and a step for supplying an oxygen-containing gas are non-simultaneously or simultaneously performed may be performed a predetermined number of times (n times). In addition, when the SiBN film is formed on the wafer, for example, a cycle in which the above-described Steps 1 and 3 and a step for supplying a boron-containing gas such as a trichloroborane ($BCl_3$) gas or the like are non-simultaneously or simultaneously performed may be performed a predetermined number of times (n times). In addition, when the SiBCN film is formed on the wafer, for example, a cycle in which the above-described Steps 1 to 3 and a step for supplying a boron-containing gas are non-simultaneously (sequentially) or simultaneously performed may be performed a predetermined number of times (n times).

In addition, for example, the above-described cleaning process can be properly applied to clean the interior of the process chamber and the interiors of the nozzles after forming a metal nitride film, such as a titanium nitride film (TiN film), a tantalum nitride film (TaN film) or the like, on the wafer. The metal nitride film such as the TiN film, the TaN film or the like is a conductive metal film.

When the TiN film is formed on the wafer, a cycle in which a step for supplying a precursor gas containing Ti such as a titanium tetrachloride ($TiCl_4$) gas or the like, and the above-described Step 3 are non-simultaneously or simultaneously performed may be performed a predetermined number of times (n times). In addition, when the TaN film is formed on the wafer, a cycle in which a step for supplying a precursor gas containing Ta, such as a tantalum pentachloride (TaCl$_5$) gas or the like, and the above-described Step 3 are non-simultaneously or simultaneously performed may be performed a predetermined number of times (n times).

That is, the present disclosure can be suitably applied to clean the interior of the process chamber by removing deposits including a semiconductor-based thin film such as a silicon-based insulating film or the like and a metal-based thin film such as a conductive metal film or the like. Even in these cases, the interior of the process chamber can be cleaned with the same procedures and process conditions as the above-described embodiment.

The process recipe for use in forming these various kinds of thin films (program in which procedures or process conditions of the film forming process are described) or the cleaning recipe for use in removing deposits including these various kinds of thin films (program in which procedures or process conditions of the cleaning process are described) may be individually prepared (a plurality things are prepared) based on contents of the film forming process or the cleaning process (the kind of film to be formed or removed, a composition ratio, a film quality, a film thickness, and the like). In addition, when a substrate processing is initiated, a suitable process recipe or cleaning recipe may be selected among the plurality of process recipes or cleaning recipes based on contents of the substrate processing. Specifically, the plurality of recipes individually prepared depending on contents of the substrate processing may be previously stored (installed) in the memory device 121c provided in the substrate processing apparatus via an electrical communication line or a recording medium (e.g., the external memory device 123) in which the recipes are recorded. In addition, when the film forming process or the cleaning process is initiated, the CPU 121a provided in the substrate processing apparatus may appropriately select a suitable recipe among the plurality of recipes stored in the memory device 121c based on contents of the substrate processing. With this configuration, thin films having a variety of film types, composition ratios, film qualities and film thicknesses can be formed or removed with high versatility and high reproducibility in one substrate processing apparatus. In addition, since an operator's work load (a load of inputting procedures or process conditions, or the like) can be lessened, it is possible to rapidly initiate the substrate processing while avoiding an operational error.

The above-described process recipe or cleaning recipe is not limited to a newly prepared recipe and may be prepared, for example, by modifying an existing recipe that is already installed in the substrate processing apparatus. When the recipe is modified, the modified recipe may be installed on the substrate processing apparatus via an electrical communication line or a recording medium in which the recipe is recorded. In addition, the recipe previously installed in the substrate processing apparatus may be directly changed by manipulating the input/output device 122 of the substrate processing apparatus.

In the above-described embodiment, an example of using a batch type substrate processing apparatus in which a plurality of substrates is processed at a time for forming a thin film has been illustrated. The present disclosure is not limited thereto but may be appropriately applied to a case in which a single-wafer type substrate processing apparatus which processes one or several substrates at a time is used to form a thin film. In addition, in the above-described embodiment, an example of using a substrate processing apparatus having a hot wall type processing furnace in forming a thin film. The present disclosure is not limited thereto but may be appropriately applied to a case in which a substrate processing apparatus having a cold wall type processing furnace is used to form a thin film. Even in these cases, process conditions may be the same as those in the above-described embodiment.

Figure 6A:
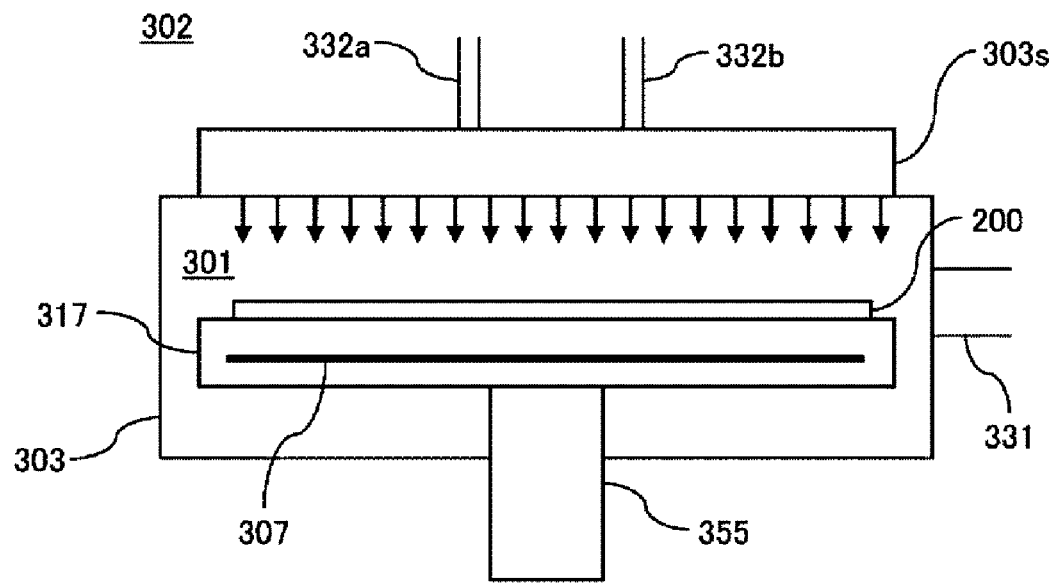
FIGS. 6A and 6B are schematic views illustrating a configuration of a vertical processing furnace of a substrate processing apparatus suitably used in another embodiment of the present disclosure, the processing furnace being shown in a longitudinal sectional view.

For example, the present disclosure may be appropriately applied to a case in which a substrate processing apparatus having a processing furnace 302 shown in FIG. 6A is used to form a film. The processing furnace 302 includes a process vessel 303 forming a process chamber 301, a shower head 303s which supplies a gas in the form of a shower into the process chamber 301, a support base 317 which supports one or several wafers 200 in a horizontal position, a rotary shaft 355 which supports the support base 317 from a bottom end of the support base 317, and a heater 307 installed in the support base 317. An inlet (gas introduction port) of the shower head 303s is connected with a gas supply port 332a for supplying the above-described precursor gas and a gas supply port 332b for supplying the above-described reaction gas. The gas supply port 332a is connected with a precursor gas supply system which is similar to the precursor gas supply system in the above-described embodiment. The gas supply port 332b is connected with a reaction gas supply system which is similar to the reaction gas supply system in the above-described embodiment. The gas supply ports 332a and 332b are connected with a cleaning gas supply system which is similar to the cleaning gas supply system in the above-described embodiment. A gas distribution plate for supplying a gas in the form of a shower into the process chamber 301 is installed in an outlet (gas discharging port) of the shower head 303s. An exhaust port 331 for exhausting the interior of the process chamber 301 is installed in the process vessel 303. The exhaust port 331 is connected with an exhaust system which is similar to the exhaust system in the above-described embodiment.

Figure 6B:
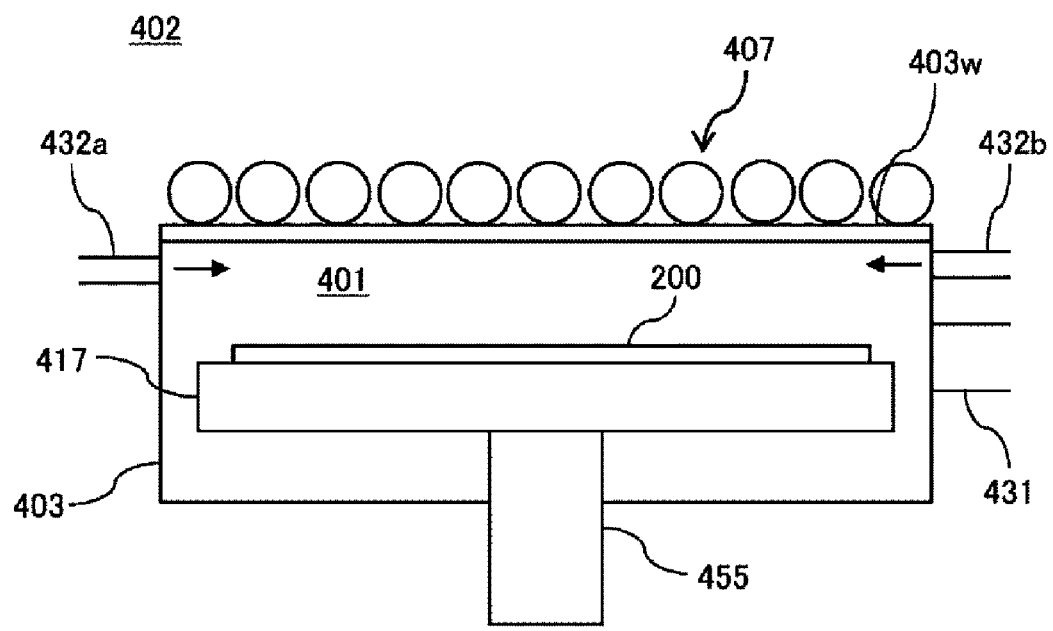

In addition, for example, the present disclosure may be appropriately applied to a case in which a substrate processing apparatus having a processing furnace 402 shown in FIG. 6B is used to form a film. The processing furnace 402 includes a process vessel 403 forming a process chamber 401, a support base 417 which supports one or several wafers 200 in a horizontal position, a rotary shaft 455 which supports the support base 417 from a bottom end of the support base 417, a lamp heater 407 which performs light irradiation on the wafers 200 in the process vessel 403, and a quartz window 403w which transmits the light from the lamp heater 407. The process vessel 403 is connected with a gas supply port 432a for supplying the above-described precursor gas and a gas supply port 432b for supplying the above-described reaction gas. The gas supply port 432a is connected with a precursor gas supply system which is similar to the precursor gas supply system in the above-described embodiment. The gas supply port 432b is connected with a reaction gas supply system which is similar to the reaction gas supply system in the above-described embodiment. The gas supply ports 432a and 432b are connected with a cleaning gas supply system which is similar to the cleaning gas supply system in the above-described embodiment. An exhaust port 431 for exhausting the interior of the process chamber 401 is installed in the process vessel 403. The exhaust port 431 is connected with an exhaust system which is similar to the exhaust system in the above-described embodiment.

Even when these substrate processing apparatuses are used, a film forming process and a cleaning process can be performed with the same sequence and process conditions as the above-described embodiment and modification.

In addition, the above-described embodiment and modification may be used in proper combination. Process conditions at that time may be the same as those in the above-described embodiment.

Examples

As an example, the substrate processing apparatus in the above-described embodiment was used to form a SiN film on a wafer according to the film forming sequence shown in FIG. 4B. A DCS gas was used as a precursor gas and a $NH_3$ gas was used as a reaction gas. Process conditions for forming a film were set to predetermined values within the range of the process conditions described in the above-described embodiment.

Thereafter, Cleaning Steps 1 to 3 were performed according to the procedure described in the above-described embodiment. A $F_2$ gas was used as a fluorine-based gas and a NO gas was used as a nitrogen oxide-based gas. In Cleaning Step 1, cleaning was performed based on the sequence of Modification 2, so that the internal pressure of the process chamber was repeatedly changed and, in Cleaning Steps 2 and 3, the internal pressure of the process chamber was maintained constant. The process conditions in Cleaning Steps 1 to 3 were process conditions described below. In addition, process conditions not described below were set to predetermined values within the range of the process conditions described in the above-described embodiment.

(Cleaning Step 1)
Internal temperature (first temperature) of process chamber: 250 to 300 degrees C.
 Flow rate of $F_2$ gas from nozzle for DCS gas supply: 1.0 to 3.0 slm
 Flow rate of $N_2$ gas from nozzle for DCS gas supply: 5.0 to 10.0 slm
 Flow rate of NO gas from nozzle for $NH_3$ gas supply: 0.5 to 2.0 slm
 Flow rate of $N_2$ gas from nozzle for $NH_3$ gas supply: 0.5 to 1.0 slm
 Pressure of process chamber: 40 to 50 Torr (5320 to 6650 Pa)
 Number of times of variations of pressure of process chamber: 5 to 10 (cycle period: 100 to 200 sec)
 Process time: 10 to 20 min
(Temperature Rising Step)
 Time required: 15 to 30 min (temperature rising rate: 5 to 10 degrees C./min
(Cleaning Step 2)
Internal temperature (second temperature) of process chamber: 400 to 450 degrees C.
 Flow rate of $F_2$ gas from nozzle for DCS gas supply: 0.5 to 1.0 slm
 Flow rate of $N_2$ gas from nozzle for DCS gas supply: 1.0 to 3.0 slm
 Flow rate of NO gas from nozzle for $NH_3$ gas supply: 0 slm (no supply)
 Flow rate of $N_2$ gas from nozzle for $NH_3$ gas supply: 5.0 to 10.0 slm
 Pressure of process chamber: 40 to 50 Torr (5320 to 6650 Pa) (constant)
 Process time: 60 to 90 min (Cleaning Step 3)
Internal temperature (second temperature) of process chamber: 400 to 450 degrees C.
 Flow rate of $F_2$ gas from nozzle for $NH_3$ gas supply: 0.5 to 1.0 slm
 Flow rate of $N_2$ gas from nozzle for $NH_3$ gas supply: 1.0 to 3.0 slm
 Flow rate of NO gas from nozzle for DCS gas supply: 0 slm (no supply)
 Flow rate of $N_2$ gas from nozzle for DCS gas supply: 5.0 to 10.0 slm
 Pressure of process chamber: 40 to 50 Torr (5320 to 6650 Pa) (constant)
 Process time: 5 to 10 min It was confirmed that deposits were removed from the inner wall of the reaction tube, the surfaces of the nozzles, the surface of the boat and so on and the surfaces of these members were smoothed by performing Cleaning Steps 1 to 3 under the above-described conditions. It was also confirmed that deposits were removed from the interiors of the nozzles.

Aspects of the Present Disclosure

Hereinafter, some aspects of the present disclosure will be supplementarily stated.
(Supplementary Note 1)
According to an aspect of the present disclosure, there is provided a cleaning method of cleaning an interior of a process chamber after performing a process of forming a film on a substrate in the process chamber heated to a film forming temperature by performing a cycle a predetermined number of times, the cycle including: supplying a precursor gas from a first nozzle heated to the film forming temperature to the substrate, and supplying a reaction gas, which is different in chemical structure from the precursor gas, from a second nozzle heated to the film forming temperature to the substrate, the cleaning method including: performing a first cleaning process of supplying a fluorine-based gas from the first nozzle heated to a first temperature and a nitrogen oxide-based gas from the second nozzle heated to the first temperature into the process chamber heated to the first temperature in order to remove deposits including the film deposited on surfaces of members in the process chamber by a thermochemical reaction; changing an internal temperature of the process chamber to a second temperature higher than the first temperature; and performing a second cleaning process of supplying the fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.
(Supplementary Note 2)
In the cleaning method according to Supplementary Note 1, in the second cleaning process, an inert gas or a nitrogen oxide-based gas is supplied from the second nozzle heated to the second temperature.
(Supplementary Note 3)
The cleaning method according to Supplementary Note 1 or 2 further includes: performing a third cleaning process of supplying a fluorine-based gas from the second nozzle heated to the second temperature into the process chamber heated to the second temperature in order to remove substances remaining on the surfaces of the members in the process chamber after removing the deposits by the thermochemical reaction and to remove deposits deposited in the second nozzle by the thermochemical reaction.
(Supplementary Note 4)
In the cleaning method according to Supplementary Note 3, in the third cleaning process, an inert gas or a nitrogen oxide-based gas is supplied from the first nozzle heated to the second temperature.
(Supplementary Note 5)
In the cleaning method according to Supplementary Note 3 or 4, a time for which the second cleaning process is performed is longer than a time for which the third cleaning process is performed.
(Supplementary Note 6)
In the cleaning method according to any one of Supplementary Notes 1 to 5, in the second cleaning process (and the third cleaning process), the surfaces of the members in the process chamber after removing the deposits are smoothed by etching.
(Supplementary Note 7)
In the cleaning method according to any one of Supplementary Notes 1 to 6, in the second cleaning process (and the third cleaning process), substances remaining on a surface of the first nozzle after removing the deposits are removed by the thermochemical reaction.
(Supplementary Note 8)
In the cleaning method according to any one of Supplementary Notes 1 to 7, in the second cleaning process (and the third cleaning process), a surface of the first nozzle after removing the deposits is smoothed by etching.
(Supplementary Note 9)
In the cleaning method according to any one of Supplementary Notes 1 to 8, in the first cleaning process, an internal pressure of the process chamber varies and, in the second cleaning process (and the third cleaning process), the internal pressure of the process chamber is maintained at a predetermined pressure.
(Supplementary Note 10)
In the cleaning method according to any one of Supplementary Notes 1 to 9, in the first cleaning process, the fluorine-based gas and the nitrogen oxide-based gas are intermittently supplied into the process chamber.
(Supplementary Note 11)
In the cleaning method according to any one of Supplementary Notes 1 to 10, in the first cleaning process, supplying the fluorine-based gas and the nitrogen oxide-based gas into the process chamber to be sealed in the process chamber and exhausting an interior of the process chamber, are repeated.
(Supplementary Note 12)
In the cleaning method according to any one of Supplementary Notes 1 to 11, in the first cleaning process, supplying the fluorine-based gas and the nitrogen oxide-based gas into the process chamber to be sealed in the process chamber, maintaining a state where the fluorine-based gas and the nitrogen oxide-based gas are sealed in the process chamber, and exhausting an interior of the process chamber, are repeated.
(Supplementary Note 13)
In the cleaning method according to Supplementary Note 11 or 12, in the first cleaning process, a mixture gas obtained by adding a nitrosyl fluoride (FNO) to the fluorine-based gas is generated by generating the nitrosyl fluoride by causing a reaction between the fluorine-based gas and the nitrogen oxide-based gas by sealing the fluorine-based gas and the nitrogen oxide-based gas in the process chamber, and by leaving a part of the fluorine-based gas without being consumed while consuming the nitrogen oxide-based gas in the reaction.
(Supplementary Note 14)
In the cleaning method according to any one of Supplementary Notes 1 to 13, in the second cleaning process (and the third cleaning process), the fluorine-based gas is continuously supplied into the process chamber.
(Supplementary Note 15)
In the cleaning method according to any one of Supplementary Notes 1 to 14, wherein the precursor gas contains an element (a first element) which is solidified for itself, and the reaction gas contains an element (a second element) which is not solidified for itself without containing an element which is solidified for itself.
(Supplementary Note 16)
In the cleaning method according to any one of Supplementary Notes 1 to 15, the precursor gas is a gas which can deposit a film for itself and the reaction gas is a gas which cannot deposit a film for itself.
(Supplementary Note 17)
According to another aspect of the present disclosure, there is provided a method of manufacturing a semiconductor device and a substrate processing method, including: forming a film on a substrate in a process chamber heated to a film forming temperature by performing a cycle a predetermined number of times, the cycle including: supplying a precursor gas from a first nozzle heated to the film forming temperature to the substrate, and supplying a reaction gas, which is different in chemical structure from the precursor gas, from a second nozzle heated to the film forming temperature to the substrate; and cleaning the interior of the process chamber after performing the act of forming the film, wherein the act of cleaning includes: performing a first cleaning process of supplying a fluorine-based gas from the first nozzle heated to a first temperature and a nitrogen oxide-based gas from the second nozzle heated to the first temperature into the process chamber heated to the first temperature in order to remove deposits including the film, which are deposited on surfaces of members in the process chamber, by a thermochemical reaction; changing an internal temperature of the process chamber to a second temperature higher than the first temperature; and performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.
(Supplementary Note 18)
According to still another aspect of the present disclosure, there is provided a substrate processing apparatus including: a process chamber configured to accommodate a substrate; a precursor gas supply system configured to supply a precursor gas from a first nozzle into the process chamber; a reaction gas supply system configured to supply a reaction gas, which is different in chemical structure from the precursor gas, from a second nozzle into the process chamber; a fluorine-based gas supply system configured to supply a fluorine-based gas into the process chamber; a nitrogen oxide-based gas supply system configured to supply a nitrogen oxide-based gas into the process chamber; a heater heating an interior of the process chamber; and a control unit configured to control the precursor gas supply system, the reaction gas supply system, the fluorine-based gas supply system, the nitrogen oxide-based gas supply system and the heater to clean an interior of the process chamber after performing a process of forming a film on a substrate in the process chamber heated to a film forming temperature by performing a cycle a predetermined number of times, the cycle including: supplying the precursor gas from the first nozzle heated to the film forming temperature to the substrate, and supplying the reaction gas from the second nozzle heated to the film forming temperature to the substrate, the act of cleaning the interior of the process chamber including: performing a first cleaning process of supplying the fluorine-based gas from the first nozzle heated to a first temperature and a nitrogen oxide-based gas from the second nozzle heated to the first temperature into the process chamber heated to the first temperature in order to remove deposits including the film deposited on surfaces of members in the process chamber by a thermochemical reaction; changing an internal temperature of the process chamber to a second temperature higher than the first temperature; and performing a second cleaning process of supplying the fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.

(Supplementary Note 19)

According to still another aspect of the present disclosure, there is provided a non-transitory computer-readable recording medium storing a program that causes a computer to perform a process of: forming a film on a substrate in a process chamber heated to a film forming temperature by performing a cycle a predetermined number of times, the cycle including: supplying a precursor gas from a first nozzle heated to the film forming temperature to the substrate, and supplying a reaction gas, which is different in chemical structure from the precursor gas, from a second nozzle heated to the film forming temperature to the substrate; and cleaning an interior of the process chamber after performing the act of forming the film, wherein the act of cleaning includes: performing a first cleaning process of supplying a fluorine-based gas from the first nozzle heated to a first temperature and a nitrogen oxide-based gas from the second nozzle heated to the first temperature into the process chamber heated to the first temperature in order to remove deposits including the film deposited on surfaces of members in the process chamber by a thermochemical reaction; changing an internal temperature of the process chamber to a second temperature higher than the first temperature; and performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction.

According to the present disclosure in some embodiments, it is possible to remove deposits adhered to the interior of the process chamber and the interiors of the nozzles after performing the film forming process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method comprising:
providing a process chamber, after performing a process of forming a film on a substrate in the process chamber heated to a film forming temperature by performing a cycle a predetermined number of times, the cycle including supplying a precursor gas from a first nozzle heated to the film forming temperature to the substrate, and supplying a reaction gas, which is different in chemical structure from the precursor gas, from a second nozzle heated to the film forming temperature to the substrate;
performing a first cleaning process of supplying a fluorine-based gas from the first nozzle heated to a first temperature into the process chamber heated to the first temperature and supplying a nitrogen oxide-based gas from the second nozzle heated to the first temperature into the process chamber heated to the first temperature in order to remove deposits including the film deposited on surfaces of members in the process chamber by a thermochemical reaction;
changing an internal temperature of the process chamber to a second temperature higher than the first temperature;
performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction; and
performing a third cleaning process of supplying a fluorine-based gas from the second nozzle heated to the second temperature into the process chamber heated to the second temperature in order to remove substances remaining on the surfaces of the members in the process chamber after removing the deposits by the thermochemical reaction and to remove deposits deposited in the second nozzle by the thermochemical reaction.

2. The cleaning method of claim 1, wherein, in the second cleaning process, an inert gas or a nitrogen oxide-based gas is supplied from the second nozzle heated to the second temperature.

3. The cleaning method of claim 1, wherein, in the third cleaning process, an inert gas or a nitrogen oxide-based gas is supplied from the first nozzle heated to the second temperature.

4. The cleaning method of claim 1, wherein a time for which the second cleaning process is performed is longer than a time for which the third cleaning process is performed.

5. The cleaning method of claim 1, wherein, in the second cleaning process and the third cleaning process, the surfaces of the members in the process chamber after removing the deposits are smoothed by etching.

6. The cleaning method of claim 1, wherein, in the second cleaning process and the third cleaning process, substances remaining on a surface of the first nozzle after removing the deposits are removed by the thermochemical reaction.

7. The cleaning method of claim 1, wherein, in the second cleaning process and the third cleaning process, a surface of the first nozzle after removing the deposits is smoothed by etching.

8. The cleaning method of claim 1, wherein, in the first cleaning process, an internal pressure of the process chamber varies and, in the second cleaning process and the third cleaning process, the internal pressure of the process chamber is maintained at a predetermined pressure.

9. The cleaning method of claim 1, wherein, in the first cleaning process, the fluorine-based gas and the nitrogen oxide-based gas are intermittently supplied into the process chamber.

10. The cleaning method of claim 1, wherein, in the first cleaning process, supplying the fluorine-based gas and the nitrogen oxide-based gas into the process chamber to be sealed in the process chamber and exhausting an interior of the process chamber, are repeated.

11. The cleaning method of claim 1, wherein, in the first cleaning process, supplying the fluorine-based gas and the nitrogen oxide-based gas into the process chamber to be sealed in the process chamber, maintaining a state where the fluorine-based gas and the nitrogen oxide-based gas are sealed in the process chamber, and exhausting an interior of the process chamber, are repeated.

12. The cleaning method of claim 1, wherein, in the first cleaning process, a mixture gas obtained by adding a nitrosyl fluoride to the fluorine-based gas is generated by generating the nitrosyl fluoride by causing a reaction between the fluorine-based gas and the nitrogen oxide-based gas by sealing the fluorine-based gas and the nitrogen oxide-based gas in the process chamber, and by leaving a part of the fluorine-based gas without being consumed while consuming the nitrogen oxide-based gas in the reaction.

13. The cleaning method of claim 1, wherein, in the second cleaning process and the third cleaning process, the fluorine-based gas is continuously supplied into the process chamber.

14. The cleaning method of claim 1, wherein the precursor gas contains an element which is solidified for itself, and the reaction gas contains an element which is not solidified for itself without containing an element which is solidified for itself.

15. The cleaning method of claim 1, wherein the precursor gas is a gas which can deposit a film for itself and the reaction gas is a gas which cannot deposit a film for itself.

16. A method of manufacturing a semiconductor device, comprising:

performing a process of forming a film on a substrate in a process chamber heated to a film forming temperature by performing a cycle a predetermined number of times, the cycle including supplying a precursor gas from a first nozzle heated to the film forming temperature to the substrate, and supplying a reaction gas, which is different in chemical structure from the precursor gas, from a second nozzle heated to the film forming temperature to the substrate; and performing a cleaning process after performing the process of forming the film, wherein the cleaning process comprising:

performing a first cleaning process of supplying a fluorine-based gas from the first nozzle heated to a first temperature into the process chamber heated to the first temperature and supplying a nitrogen oxide-based gas from the second nozzle heated to the first temperature into the process chamber heated to the first temperature in order to remove deposits including the film deposited on surfaces of members in the process chamber by a thermochemical reaction;

changing an internal temperature of the process chamber to a second temperature higher than the first temperature;

performing a second cleaning process of supplying a fluorine-based gas from the first nozzle heated to the second temperature into the process chamber heated to the second temperature in order to remove substances remaining on the surfaces of the members in the process chamber after removing the deposits by the thermochemical reaction and to remove deposits deposited in the first nozzle by the thermochemical reaction; and performing a third cleaning process of supplying a fluorine-based gas from the second nozzle heated to the second temperature into the process chamber heated to the second temperature in order to remove substances remaining on the surfaces of the members in the process chamber after removing the deposits by the thermochemical reaction and to remove deposits deposited in the second nozzle by the thermochemical reaction.

* * * * *